US010719339B2

(12) United States Patent
Lawrence

(10) Patent No.: US 10,719,339 B2
(45) Date of Patent: Jul. 21, 2020

(54) COMPUTER ARCHITECTURE FOR EMULATING A QUANTIZER IN A CORRELITHM OBJECT PROCESSING SYSTEM

(71) Applicant: BANK OF AMERICA CORPORATION, Charlotte, NC (US)

(72) Inventor: Patrick N. Lawrence, Plano, TX (US)

(73) Assignee: Bank of America Corporation, Charlotte, NC (US)

(*) Notice: Subject to any disclaimer, the term of this patent is extended or adjusted under 35 U.S.C. 154(b) by 358 days.

(21) Appl. No.: 15/787,373

(22) Filed: Oct. 18, 2017

(65) Prior Publication Data

US 2019/0114188 A1 Apr. 18, 2019

(51) Int. Cl.
*G06F 17/50* (2006.01)
*G06F 9/455* (2018.01)
*G06F 17/18* (2006.01)
*G06F 7/00* (2006.01)
*G06F 15/00* (2006.01)
*G06F 30/00* (2020.01)

(52) U.S. Cl.
CPC .......... *G06F 9/45508* (2013.01); *G06F 7/00* (2013.01); *G06F 15/00* (2013.01); *G06F 17/18* (2013.01); *G06F 30/00* (2020.01)

(58) Field of Classification Search
CPC ..... H04L 27/361; H04L 1/0065; H04N 19/00; H03M 13/13; G09G 3/006
See application file for complete search history.

(56) References Cited

U.S. PATENT DOCUMENTS

| 4,675,743 | A | * | 6/1987 | Riseman | G06K 15/128 |
| | | | | | 358/3.23 |
| 5,003,539 | A | * | 3/1991 | Takemoto | H03M 13/13 |
| | | | | | 714/785 |
| 5,946,673 | A | | 8/1999 | Francone et al. | |
| 6,167,391 | A | | 12/2000 | Lawrence | |

(Continued)

OTHER PUBLICATIONS

Meersman, R. et al., "On the Move to Meaningful Internet Systems 2005: CoopIS, DOA and ODBASE," OTM Confederated International Conferences CoopIS, DOA and ODBASE Oct. 2005 Agia Napa, Cyprus, Proceedings, Part I, Oct. 31-Nov. 4, 2005, pp. 763-779.

(Continued)

*Primary Examiner* — Kandasamy Thangavelu
(74) *Attorney, Agent, or Firm* — Michael A. Springs

(57) ABSTRACT

A device that includes a sensor engine and a node engine. The sensor engine is configured to receive an input signal representing a data sample and identify a real world value entry in a sensor table based on the input signal. The sensor engine is further configured to fetch an input correlithm object in the sensor table linked with the real world value entry and send the input correlithm object to a node engine. The node engine is configured to determine distances between the input correlithm object and each of the child correlithm objects in a node table in response to receiving the input correlithm object and identify a child correlithm object from the node table with the shortest distance. The node engine is further configured to fetch a parent correlithm object from the node table linked with the identified child correlithm object and output the identified parent correlithm object.

20 Claims, 19 Drawing Sheets

(56) References Cited

U.S. PATENT DOCUMENTS

| | | | |
|---|---|---|---|
| 6,556,151 B1* | 4/2003 | Smeets | H03M 7/40 |
| | | | 341/87 |
| 6,941,287 B1 | 9/2005 | Vaidyanathan et al. | |
| 6,943,686 B2 | 9/2005 | Allen | |
| 6,947,913 B1 | 9/2005 | Lawrence | |
| 7,015,835 B2 | 3/2006 | Lawrence et al. | |
| 7,031,969 B2 | 4/2006 | Lawrence et al. | |
| 7,246,129 B2 | 7/2007 | Lawrence et al. | |
| 7,310,622 B2 | 12/2007 | Lawrence et al. | |
| 7,349,928 B2 | 3/2008 | Lawrence et al. | |
| 2003/0147005 A1* | 8/2003 | Okamoto | H04L 1/0065 |
| | | | 348/473 |
| 2005/0259875 A1* | 11/2005 | Imura | H04N 19/00 |
| | | | 382/232 |
| 2008/0212707 A1* | 9/2008 | Rofougaran | H04L 27/361 |
| | | | 375/269 |
| 2018/0061290 A1* | 3/2018 | Kwon | G09G 3/006 |

OTHER PUBLICATIONS

Lawrence, P. N., "Correlithm Object Technology," Apr. 2004, 229 pages.

Lawrence, P. N., "Computer Architecture for Emulating Correlithm Object Cores in a Correlithm Object Processing System," U.S. Appl. No. 15/787,464, filed Oct. 18, 2017, 82 pages.

Lawrence, P. N., "Computer Architecture for Emulating Adjustable Correlithm Object Cores in a Correlithm Object Processing System," U.S. Appl. No. 15/787,500, filed Oct. 18, 2017, 82 pages.

Lawrence, P. N., "Computer Architecture for Emulating Drift-Between String Correlithm Objects in a Correlithm Object Processing System," U.S. Appl. No. 15/787,533, filed Oct. 18, 2017, 85 pages.

Lawrence, P. N., "Computer Architecture for Emulating Drift-Away String Correlithm Objects in a Correlithm Object Processing System," U.S. Appl. No. 15/787,559, filed Oct. 18, 2017, 82 pages.

Lawrence, P. N., Computer Architecture for Detecting Members of Correlithm Object Cores in a Correlithm Object Processing System, U.S. Appl. No. 15/787,582, filed Oct. 18, 2017, 82 pages.

* cited by examiner

COMPUTER ARCHITECTURE FOR EMULATING A QUANTIZER IN A CORRELITHM OBJECT PROCESSING SYSTEM

TECHNICAL FIELD

The present disclosure relates generally to computer architectures for emulating a processing system, and more specifically to computer architectures for emulating a correlithm object processing system.

BACKGROUND

Conventional computers are highly attuned to using operations that require manipulating ordinal numbers, especially ordinal binary integers. The value of an ordinal number corresponds with its position in a set of sequentially ordered number values. These computers use ordinal binary integers to represent, manipulate, and store information. These computers rely on the numerical order of ordinal binary integers representing data to perform various operations such as counting, sorting, indexing, and mathematical calculations. Even when performing operations that involve other number systems (e.g. floating point), conventional computers still resort to using ordinal binary integers to perform any operations.

Ordinal based number systems only provide information about the sequence order of the numbers themselves based on their numeric values. Ordinal numbers do not provide any information about any other types of relationships for the data being represented by the numeric values such as similarity. For example, when a conventional computer uses ordinal numbers to represent data samples (e.g. images or audio signals), different data samples are represented by different numeric values. The different numeric values do not provide any information about how similar or dissimilar one data sample is from another. Unless there is an exact match in ordinal number values, conventional systems are unable to tell if a data sample matches or is similar to any other data samples. As a result, conventional computers are unable to use ordinal numbers by themselves for comparing different data samples and instead these computers rely on complex signal processing techniques. Determining whether a data sample matches or is similar to other data samples is not a trivial task and poses several technical challenges for conventional computers. These technical challenges result in complex processes that consume processing power which reduces the speed and performance of the system. The ability to compare unknown data samples to known data samples is crucial for many security applications such as face recognition, voice recognition, and fraud detection.

Thus, it is desirable to provide a solution that allows computing systems to efficiently determine how similar different data samples are to each other and to perform operations based on their similarity.

SUMMARY

Conventional computers are highly attuned to using operations that require manipulating ordinal numbers, especially ordinal binary integers. The value of an ordinal number corresponds with its position in a set of sequentially ordered number values. These computers use ordinal binary integers to represent, manipulate, and store information. These computers rely on the numerical order of ordinal binary integers representing data to perform various operations such as counting, sorting, indexing, and mathematical calculations. Even when performing operations that involve other number systems (e.g. floating point), conventional computers still resort to using ordinal binary integers to perform any operations.

Ordinal based number systems only provide information about the sequence order of the numbers themselves based on their numeric values. Ordinal numbers do not provide any information about any other types of relationships for the data being represented by the numeric values such as similarity. For example, when a conventional computer uses ordinal numbers to represent data samples (e.g. images or audio signals), different data samples are represented by different numeric values. The different numeric values do not provide any information about how similar or dissimilar one data sample is from another. Unless there is an exact match in ordinal number values, conventional systems are unable to tell if a data sample matches or is similar to any other data samples. As a result, conventional computers are unable to use ordinal numbers by themselves for comparing different data samples and instead these computers rely on complex signal processing techniques. Determining whether a data sample matches or is similar to other data samples is not a trivial task and poses several technical challenges for conventional computers. These technical challenges result in complex processes that consume processing power which reduces the speed and performance of the system. The ability to compare unknown data samples to known data samples is crucial for many applications such as security application (e.g. face recognition, voice recognition, and fraud detection).

The system described in the present application provides a technical solution that enables the system to efficiently determine how similar different objects are to each other and to perform operations based on their similarity. In contrast to conventional systems, the system uses an unconventional configuration to perform various operations using categorical numbers and geometric objects, also referred to as correlithm objects, instead of ordinal numbers. Using categorical numbers and correlithm objects on a conventional device involves changing the traditional operation of the computer to support representing and manipulating concepts as correlithm objects. A device or system may be configured to implement or emulate a special purpose computing device capable of performing operations using correlithm objects. Implementing or emulating a correlithm object processing system improves the operation of a device by enabling the device to perform non-binary comparisons (i.e. match or no match) between different data samples. This enables the device to quantify a degree of similarity between different data samples. This increases the flexibility of the device to work with data samples having different data types and/or formats, and also increases the speed and performance of the device when performing operations using data samples. These technical advantages and other improvements to the device are described in more detail throughout the disclosure.

In one embodiment, the system is configured to use binary integers as categorical numbers rather than ordinal numbers which enables the system to determine how similar a data sample is to other data samples. Categorical numbers provide information about similar or dissimilar different data samples are from each other. For example, categorical numbers can be used in facial recognition applications to represent different images of faces and/or features of the faces. The system provides a technical advantage by allowing the system to assign correlithm objects represented by categorical numbers to different data samples based on how similar they are to other data samples. As an example, the system is able to assign correlithm objects to different images of people such that the correlithm objects can be directly used to determine how similar the people in the images are to each other. In other words, the system is able to use correlithm objects in facial recognition applications to quickly determine whether a captured image of a person matches any previously stored images without relying on conventional signal processing techniques.

Correlithm object processing systems use new types of data structures called correlithm objects that improve the way a device operates, for example, by enabling the device to perform non-binary data set comparisons and to quantify the similarity between different data samples. Correlithm objects are data structures designed to improve the way a device stores, retrieves, and compares data samples in memory. Correlithm objects also provide a data structure that is independent of the data type and format of the data samples they represent. Correlithm objects allow data samples to be directly compared regardless of their original data type and/or format.

A correlithm object processing system uses a combination of a sensor table, a node table, and/or an actor table to provide a specific set of rules that improve computer-related technologies by enabling devices to compare and to determine the degree of similarity between different data samples regardless of the data type and/or format of the data sample they represent. The ability to directly compare data samples having different data types and/or formatting is a new functionality that cannot be performed using conventional computing systems and data structures.

In addition, correlithm object processing system uses a combination of a sensor table, a node table, and/or an actor table to provide a particular manner for transforming data samples between ordinal number representations and correlithm objects in a correlithm object domain. Transforming data samples between ordinal number representations and correlithm objects involves fundamentally changing the data type of data samples between an ordinal number system and a categorical number system to achieve the previously described benefits of the correlithm object processing system.

Using correlithm objects allows the system or device to compare data samples (e.g. images) even when the input data sample does not exactly match any known or previously stored input values. For example, an input data sample that is an image may have different lighting conditions than the previously stored images. The differences in lighting conditions can make images of the same person appear different from each other. The device uses an unconventional configuration that implements a correlithm object processing system that uses the distance between the data samples which are represented as correlithm objects and other known data samples to determine whether the input data sample matches or is similar to the other known data samples. Implementing a correlithm object processing system fundamentally changes the device and the traditional data processing paradigm. Implementing the correlithm object processing system improves the operation of the device by enabling the device to perform non-binary comparisons of data samples. In other words, the device is able to determine how similar the data samples are to each other even when the data samples are not exact matches. In addition, the device is able to quantify how similar data samples are to one another. The ability to determine how similar data samples are to each other is unique and distinct from conventional computers that can only perform binary comparisons to identify exact matches.

The problems associated with comparing data sets and identifying matches based on the comparison are problems necessarily rooted in computer technologies. As described above, conventional systems are limited to a binary comparison that can only determine whether an exact match is found. Emulating a correlithm object processing system provides a technical solution that addresses problems associated with comparing data sets and identifying matches. Using correlithm objects to represent data samples fundamentally changes the operation of a device and how the device views data samples. By implementing a correlithm object processing system, the device can determine the distance between the data samples and other known data samples to determine whether the input data sample matches or is similar to the other known data samples. In addition, the device is able to determine a degree of similarity that quantifies how similar different data samples are to one another.

Certain embodiments of the present disclosure may include some, all, or none of these advantages. These advantages and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

FIGS. 1-5 generally describe various embodiments of how a correlithm object processing system may be implemented or emulated in hardware, such as a special purpose computer.

Figure 1:
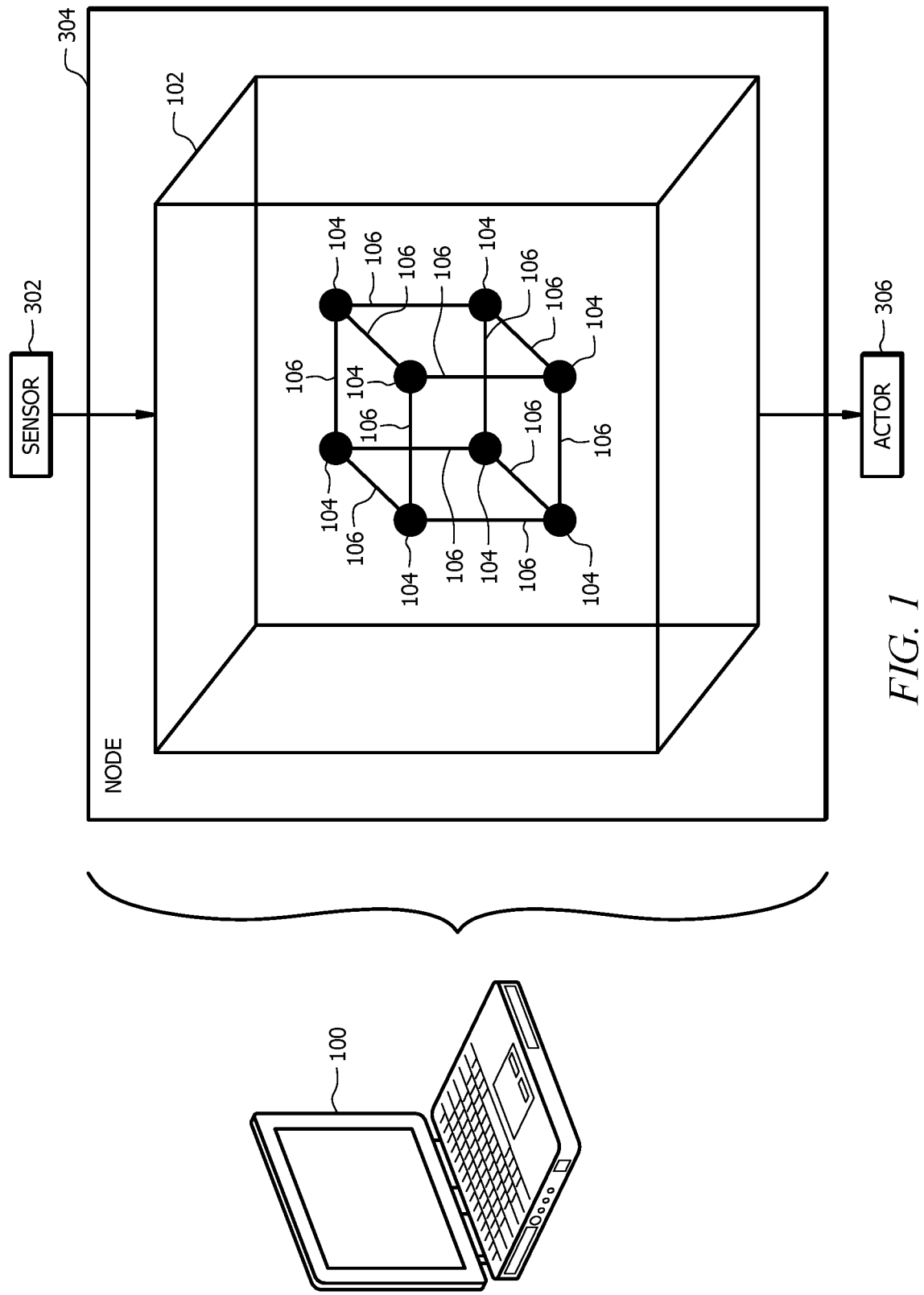
FIG. 1 is a schematic view of an embodiment of a special purpose computer implementing correlithm objects in an n-dimensional space.

FIG. 1 is a schematic view of an embodiment of a user device 100 implementing correlithm objects 104 in an n-dimensional space 102. Examples of user devices 100 include, but are not limited to, desktop computers, mobile phones, tablet computers, laptop computers, or other special purpose computer platforms. The user device 100 is configured to implement or emulate a correlithm object processing system that uses categorical numbers to represent data samples as correlithm objects 104 in a high-dimensional space 102, for example a high-dimensional binary cube. Additional information about the correlithm object processing system is described in FIG. 3. Additional information about configuring the user device 100 to implement or emulate a correlithm object processing system is described in FIG. 5.

Conventional computers rely on the numerical order of ordinal binary integers representing data to perform various operations such as counting, sorting, indexing, and mathematical calculations. Even when performing operations that involve other number systems (e.g. floating point), conventional computers still resort to using ordinal binary integers to perform any operations. Ordinal based number systems only provide information about the sequence order of the numbers themselves based on their numeric values. Ordinal numbers do not provide any information about any other types of relationships for the data being represented by the numeric values, such as similarity. For example, when a conventional computer uses ordinal numbers to represent data samples (e.g. images or audio signals), different data samples are represented by different numeric values. The different numeric values do not provide any information about how similar or dissimilar one data sample is from another. In other words, conventional computers are only able to make binary comparisons of data samples which only results in determining whether the data samples match or do not match. Unless there is an exact match in ordinal number values, conventional systems are unable to tell if a data sample matches or is similar to any other data samples. As a result, conventional computers are unable to use ordinal numbers by themselves for determining similarity between different data samples, and instead these computers rely on complex signal processing techniques. Determining whether a data sample matches or is similar to other data samples is not a trivial task and poses several technical challenges for conventional computers. These technical challenges result in complex processes that consume processing power which reduces the speed and performance of the system.

In contrast to conventional systems, the user device 100 operates as a special purpose machine for implementing or emulating a correlithm object processing system. Implementing or emulating a correlithm object processing system improves the operation of the user device 100 by enabling the user device 100 to perform non-binary comparisons (i.e. match or no match) between different data samples. This enables the user device 100 to quantify a degree of similarity between different data samples. This increases the flexibility of the user device 100 to work with data samples having different data types and/or formats, and also increases the speed and performance of the user device 100 when performing operations using data samples. These improvements and other benefits to the user device 100 are described in more detail below and throughout the disclosure.

For example, the user device 100 employs the correlithm object processing system to allow the user device 100 to compare data samples even when the input data sample does not exactly match any known or previously stored input values. Implementing a correlithm object processing system fundamentally changes the user device 100 and the traditional data processing paradigm. Implementing the correlithm object processing system improves the operation of the user device 100 by enabling the user device 100 to perform non-binary comparisons of data samples. In other words, the user device 100 is able to determine how similar the data samples are to each other even when the data samples are not exact matches. In addition, the user device 100 is able to quantify how similar data samples are to one another. The ability to determine how similar data samples are to each others is unique and distinct from conventional computers that can only perform binary comparisons to identify exact matches.

The user device's 100 ability to perform non-binary comparisons of data samples also fundamentally changes traditional data searching paradigms. For example, conventional search engines rely on finding exact matches or exact partial matches of search tokens to identify related data samples. For instance, conventional text-based search engine are limited to finding related data samples that have text that exactly matches other data samples. These search engines only provide a binary result that identifies whether or not an exact match was found based on the search token. Implementing the correlithm object processing system improves the operation of the user device 100 by enabling the user device 100 to identify related data samples based on how similar the search token is to other data sample. These improvements result in increased flexibility and faster search time when using a correlithm object processing system. The ability to identify similarities between data samples expands the capabilities of a search engine to include data samples that may not have an exact match with a search token but are still related and similar in some aspects. The user device 100 is also able to quantify how similar data samples are to each other based on characteristics besides exact matches to the search token. Implementing the correlithm object processing system involves operating the user device 100 in an unconventional manner to achieve these technological improvements as well as other benefits described below for the user device 100.

Computing devices typically rely on the ability to compare data sets (e.g. data samples) to one another for processing. For example, in security or authentication applications a computing device is configured to compare an input of an unknown person to a data set of known people (or biometric information associated with these people). The problems associated with comparing data sets and identifying matches based on the comparison are problems necessarily rooted in computer technologies. As described above, conventional systems are limited to a binary comparison that can only determine whether an exact match is found. As an example, an input data sample that is an image of a person may have different lighting conditions than previously stored images. In this example, different lighting conditions can make images of the same person appear different from each other. Conventional computers are unable to distinguish between two images of the same person with different lighting conditions and two images of two different people without complicated signal processing. In both of these cases, conventional computers can only determine that the images are different. This is because conventional computers rely on manipulating ordinal numbers for processing.

In contrast, the user device 100 uses an unconventional configuration that uses correlithm objects to represent data samples. Using correlithm objects to represent data samples fundamentally changes the operation of the user device 100 and how the device views data samples. By implementing a correlithm object processing system, the user device 100 can determine the distance between the data samples and other known data samples to determine whether the input data sample matches or is similar to the other known data samples, as explained in detail below. Unlike the conventional computers described in the previous example, the user device 100 is able to distinguish between two images of the same person with different lighting conditions and two images of two different people by using correlithm objects 104. Correlithm objects allow the user device 100 to determine whether there are any similarities between data samples, such as between two images that are different from each other in some respects but similar in other respects. For example, the user device 100 is able to determine that despite different lighting conditions, the same person is present in both images.

In addition, the user device 100 is able to determine a degree of similarity that quantifies how similar different data samples are to one another. Implementing a correlithm object processing system in the user device 100 improves the operation of the user device 100 when comparing data sets and identifying matches by allowing the user device 100 to perform non-binary comparisons between data sets and to quantify the similarity between different data samples. In addition, using a correlithm object processing system results in increased flexibility and faster search times when comparing data samples or data sets. Thus, implementing a correlithm object processing system in the user device 100 provides a technical solution to a problem necessarily rooted in computer technologies.

The ability to implement a correlithm object processing system provides a technical advantage by allowing the system to identify and compare data samples regardless of whether an exact match has been previous observed or stored. In other words, using the correlithm object processing system the user device 100 is able to identify similar data samples to an input data sample in the absence of an exact match. This functionality is unique and distinct from conventional computers that can only identify data samples with exact matches.

Examples of data samples include, but are not limited to, images, files, text, audio signals, biometric signals, electric signals, or any other suitable type of data. A correlithm object 104 is a point in the n-dimensional space 102, sometimes called an "n-space." The value of represents the number of dimensions of the space. For example, an n-dimensional space 102 may be a 3-dimensional space, a 50-dimensional space, a 100-dimensional space, or any other suitable dimension space. The number of dimensions depends on its ability to support certain statistical tests, such as the distances between pairs of randomly chosen points in the space approximating a normal distribution. In some embodiments, increasing the number of dimensions in the n-dimensional space 102 modifies the statistical properties of the system to provide improved results. Increasing the number of dimensions increases the probability that a correlithm object 104 is similar to other adjacent correlithm objects 104. In other words, increasing the number of dimensions increases the correlation between how close a pair of correlithm objects 104 are to each other and how similar the correlithm objects 104 are to each other.

Correlithm object processing systems use new types of data structures called correlithm objects 104 that improve the way a device operates, for example, by enabling the device to perform non-binary data set comparisons and to quantify the similarity between different data samples. Correlithm objects 104 are data structures designed to improve the way a device stores, retrieves, and compares data samples in memory. Unlike conventional data structures, correlithm objects 104 are data structures where objects can be expressed in a high-dimensional space such that distance 106 between points in the space represent the similarity between different objects or data samples. In other words, the distance 106 between a pair of correlithm objects 104 in the n-dimensional space 102 indicates how similar the correlithm objects 104 are from each other and the data samples they represent. Correlithm objects 104 that are close to each other are more similar to each other than correlithm objects 104 that are further apart from each other. For example, in a facial recognition application, correlithm objects 104 used to represent images of different types of glasses may be relatively close to each other compared to correlithm objects 104 used to represent images of other features such as facial hair. An exact match between two data samples occurs when their corresponding correlithm objects 104 are the same or have no distance between them. When two data samples are not exact matches but are similar, the distance between their correlithm objects 104 can be used to indicate their similarities. In other words, the distance 106 between correlithm objects 104 can be used to identify both data samples that exactly match each other as well as data samples that do not match but are similar. This feature is unique to a correlithm processing system and is unlike conventional computers that are unable to detect when data samples are different but similar in some aspects.

Correlithm objects 104 also provide a data structure that is independent of the data type and format of the data samples they represent. Correlithm objects 104 allow data samples to be directly compared regardless of their original data type and/or format. In some instances, comparing data samples as correlithm objects 104 is computationally more efficient and faster than comparing data samples in their original format. For example, comparing images using conventional data structures involves significant amounts of image processing which is time consuming and consumes processing resources. Thus, using correlithm objects 104 to represent data samples provides increased flexibility and improved performance compared to using other conventional data structures.

In one embodiment, correlithm objects 104 may be represented using categorical binary strings. The number of bits used to represent the correlithm object 104 corresponds with the number of dimensions of the n-dimensional space 102 where the correlithm object 102 is located. For example, each correlithm object 104 may be uniquely identified using a 64-bit string in a 64-dimensional space 102. As another example, each correlithm object 104 may be uniquely identified using a 10-bit string in a 10-dimensional space 102. In other examples, correlithm objects 104 can be identified using any other suitable number of bits in a string that corresponds with the number of dimensions in the n-dimensional space 102.

In this configuration, the distance 106 between two correlithm objects 104 can be determined based on the differences between the bits of the two correlithm objects 104. In other words, the distance 106 between two correlithm objects can be determined based on how many individual bits differ between the correlithm objects 104. The distance 106 between two correlithm objects 104 can be computed using hamming distance or any other suitable technique.

As an example using a 10-dimensional space 102, a first correlithm object 104 is represented by a first 10-bit string (1001011011) and a second correlithm object 104 is represented by a second 10-bit string (1000011011). The hamming distance corresponds with the number of bits that differ between the first correlithm object 104 and the second correlithm object 104. In other words, the hamming distance between the first correlithm object 104 and the second correlithm object 104 can be computed as follows:

$$\frac{\begin{array}{r}1001011011\\1000011011\end{array}}{0001000000}$$

In this example, the hamming distance is equal to one because only one bit differs between the first correlithm object 104 and the second correlithm object. As another example, a third correlithm object 104 is represented by a third 10-bit string (0110100100). In this example, the hamming distance between the first correlithm object 104 and the third correlithm object 104 can be computed as follows:

$$\frac{\begin{array}{r}1001011011\\0110100100\end{array}}{1111111111}$$

The hamming distance is equal to ten because all of the bits are different between the first correlithm object 104 and the third correlithm object 104. In the previous example, a hamming distance equal to one indicates that the first correlithm object 104 and the second correlithm object 104 are close to each other in the n-dimensional space 102, which means they are similar to each other. In the second example, a hamming distance equal to ten indicates that the first correlithm object 104 and the third correlithm object 104 are further from each other in the n-dimensional space 102 and are less similar to each other than the first correlithm object 104 and the second correlithm object 104. In other words, the similarity between a pair of correlithm objects can be readily determined based on the distance between the pair correlithm objects.

As another example, the distance between a pair of correlithm objects 104 can be determined by performing an XOR operation between the pair of correlithm objects 104 and counting the number of logical high values in the binary string. The number of logical high values indicates the number of bits that are different between the pair of correlithm objects 104 which also corresponds with the hamming distance between the pair of correlithm objects 104.

In another embodiment, the distance 106 between two correlithm objects 104 can be determined using a Minkowski distance such as the Euclidean or "straight-line" distance between the correlithm objects 104. For example, the distance 106 between a pair of correlithm objects 104 may be determined by calculating the square root of the sum of squares of the coordinate difference in each dimension.

The user device 100 is configured to implement or emulate a correlithm object processing system that comprises one or more sensors 302, nodes 304, and/or actors 306 in order to convert data samples between real world values or representations and to correlithm objects 104 in a correlithm object domain. Sensors 302 are generally configured to convert real world data samples to the correlithm object domain. Nodes 304 are generally configured to process or perform various operations on correlithm objects in the correlithm object domain. Actors 306 are generally configured to convert correlithm objects 104 into real world values or representations. Additional information about sensors 302, nodes 304, and actors 306 is described in FIG. 3.

Performing operations using correlithm objects 104 in a correlithm object domain allows the user device 100 to identify relationships between data samples that cannot be identified using conventional data processing systems. For example, in the correlithm object domain, the user device 100 is able to identify not only data samples that exactly match an input data sample, but also other data samples that have similar characteristics or features as the input data samples. Conventional computers are unable to identify these types of relationships readily. Using correlithm objects 104 improves the operation of the user device 100 by enabling the user device 100 to efficiently process data samples and identify relationships between data samples without relying on signal processing techniques that require a significant amount of processing resources. These benefits allow the user device 100 to operate more efficiently than conventional computers by reducing the amount of processing power and resources that are needed to perform various operations.

Figure 2:
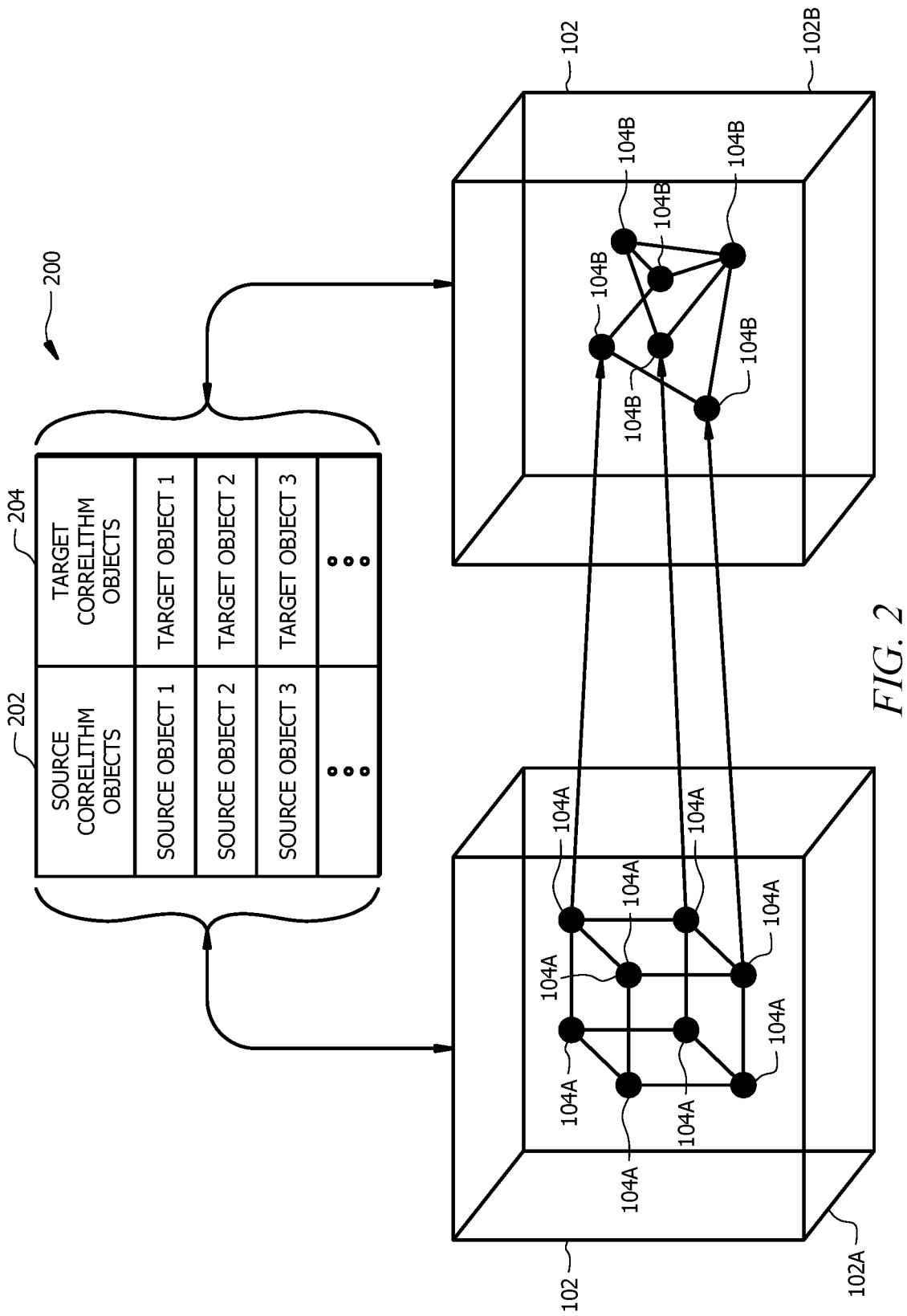
FIG. 2 is a perspective view of an embodiment of a mapping between correlithm objects in different n-dimensional spaces.

FIG. 2 is a schematic view of an embodiment of a mapping between correlithm objects 104 in different n-dimensional spaces 102. When implementing a correlithm object processing system, the user device 100 performs operations within the correlithm object domain using correlithm objects 104 in different n-dimensional spaces 102. As an example, the user device 100 may convert different types of data samples having real world values into correlithm objects 104 in different n-dimensional spaces 102. For instance, the user device 100 may convert data samples of text into a first set of correlithm objects 104 in a first n-dimensional space 102 and data samples of audio samples as a second set of correlithm objects 104 in a second n-dimensional space 102. Conventional systems require data samples to be of the same type and/or format in order to perform any kind of operation on the data samples. In some instances, some types of data samples cannot be compared because there is no common format available. For example, conventional computers are unable to compare data samples of images and data samples of audio samples because there is no common format. In contrast, the user device 100 implementing a correlithm object processing system is able to compare and perform operations using correlithm objects 104 in the correlithm object domain regardless of the type or format of the original data samples.

In FIG. 2, a first set of correlithm objects 104A are defined within a first n-dimensional space 102A and a second set of correlithm objects 104B are defined within a second n-dimensional space 102B. The n-dimensional spaces may have the same number dimensions or a different number of dimensions. For example, the first n-dimensional space 102A and the second n-dimensional space 102B may both be three dimensional spaces. As another example, the first n-dimensional space 102A may be a three dimensional space and the second n-dimensional space 102B may be a nine dimensional space. Correlithm objects 104 in the first n-dimensional space 102A and second n-dimensional space 102B are mapped to each other. In other words, a correlithm object 104A in the first n-dimensional space 102A may reference or be linked with a particular correlithm object 104B in the second n-dimensional space 102B. The correlithm objects 104 may also be linked with and referenced with other correlithm objects 104 in other n-dimensional spaces 102.

In one embodiment, a data structure such as table 200 may be used to map or link correlithm objects 194 in different n-dimensional spaces 102. In some instances, table 200 is referred to as a node table. Table 200 is generally configured to identify a first plurality of correlithm objects 104 in a first n-dimensional space 102 and a second plurality of correlithm objects 104 in a second n-dimensional space 102. Each correlithm object 104 in the first n-dimensional space 102 is linked with a correlithm object 104 is the second n-dimensional space 102. For example, table 200 may be configured with a first column 202 that lists correlithm objects 104A as source correlithm objects and a second column 204 that lists corresponding correlithm objects 104B as target correlithm objects. In other examples, table 200 may be configured in any other suitable manner or may be implemented using any other suitable data structure. In some embodiments, one or more mapping functions may be used to convert between a correlithm object 104 in a first n-dimensional space and a correlithm object 104 is a second n-dimensional space.

Figure 3:
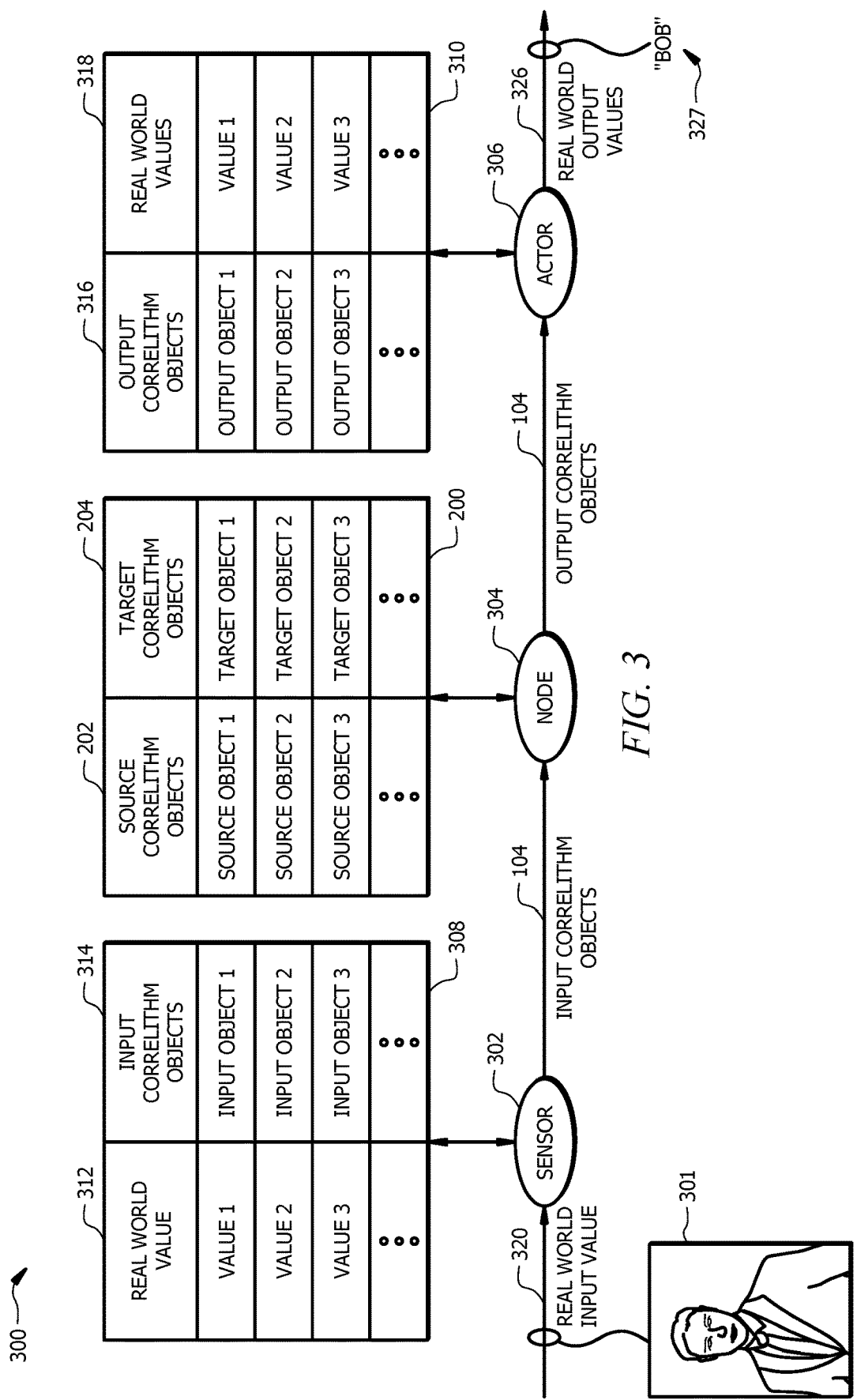
FIG. 3 is a schematic view of an embodiment of a correlithm object processing system.

FIG. 3 is a schematic view of an embodiment of a correlithm object processing system 300 that is implemented by a user device 100 to perform operations using correlithm objects 104. The system 300 generally comprises a sensor 302, a node 304, and an actor 306. The system 300 may be configured with any suitable number and/or configuration of sensors 302, nodes 304, and actors 306. An example of the system 300 in operation is described in FIG. 4. In one embodiment, a sensor 302, a node 304, and an actor 306 may all be implemented on the same device (e.g. user device 100). In other embodiments, a sensor 302, a node 304, and an actor 306 may each be implemented on different devices in signal communication with each other for example over a network. In other embodiments, different devices may be configured to implement any combination of sensors 302, nodes 304, and actors 306.

Sensors 302 serve as interfaces that allow a user device 100 to convert real world data samples into correlithm objects 104 that can be used in the correlithm object domain. Sensors 302 enable the user device 100 compare and perform operations using correlithm objects 104 regardless of the data type or format of the original data sample. Sensors 302 are configured to receive a real world value 320 representing a data sample as an input, to determine a correlithm object 104 based on the real world value 320, and to output the correlithm object 104. For example, the sensor 302 may receive an image 301 of a person and output a correlithm object 322 to the node 304 or actor 306. In one embodiment, sensors 302 are configured to use sensor tables 308 that link a plurality of real world values with a plurality of correlithm objects 104 in an n-dimensional space 102. Real world values are any type of signal, value, or representation of data samples. Examples of real world values include, but are not limited to, images, pixel values, text, audio signals, electrical signals, and biometric signals. As an example, a sensor table 308 may be configured with a first column 312 that lists real world value entries corresponding with different images and a second column 314 that lists corresponding correlithm objects 104 as input correlithm objects. In other examples, sensor tables 308 may be configured in any other suitable manner or may be implemented using any other suitable data structure. In some embodiments, one or more mapping functions may be used to translate between a real world value 320 and a correlithm object 104 is a n-dimensional space 102. Additional information for implementing or emulating a sensor 302 in hardware is described in FIG. 5.

Nodes 304 are configured to receive a correlithm object 104 (e.g. an input correlithm object 104), to determine another correlithm object 104 based on the received correlithm object 104, and to output the identified correlithm object 104 (e.g. an output correlithm object 104). In one embodiment, nodes 304 are configured to use node tables 200 that link a plurality of correlithm objects 104 from a first n-dimensional space 102 with a plurality of correlithm objects 104 in a second n-dimensional space 102. A node table 200 may be configured similar to the table 200 described in FIG. 2. Additional information for implementing or emulating a node 304 in hardware is described in FIG. 5.

Actors 306 serve as interfaces that allow a user device 100 to convert correlithm objects 104 in the correlithm object domain back to real world values or data samples. Actors 306 enable the user device 100 to convert from correlithm objects 104 into any suitable type of real world value. Actors 306 are configured to receive a correlithm object 104 (e.g. an output correlithm object 104), to determine a real world output value 326 based on the received correlithm object 104, and to output the real world output value 326. The real world output value 326 may be a different data type or representation of the original data sample. As an example, the real world input value 320 may be an image 301 of a person and the resulting real world output value 326 may be text 327 and/or an audio signal identifying the person. In one embodiment, actors 306 are configured to use actor tables 310 that link a plurality of correlithm objects 104 in an n-dimensional space 102 with a plurality of real world values. As an example, an actor table 310 may be configured with a first column 316 that lists correlithm objects 104 as output correlithm objects and a second column 318 that lists real world values. In other examples, actor tables 310 may be configured in any other suitable manner or may be implemented using any other suitable data structure. In some embodiments, one or more mapping functions may be employed to translate between a correlithm object 104 in an n-dimensional space and a real world output value 326. Additional information for implementing or emulating an actor 306 in hardware is described in FIG. 5.

A correlithm object processing system 300 uses a combination of a sensor table 308, a node table 200, and/or an actor table 310 to provide a specific set of rules that improve computer-related technologies by enabling devices to compare and to determine the degree of similarity between different data samples regardless of the data type and/or format of the data sample they represent. The ability to directly compare data samples having different data types and/or formatting is a new functionality that cannot be performed using conventional computing systems and data structures. Conventional systems require data samples to be of the same type and/or format in order to perform any kind of operation on the data samples. In some instances, some types of data samples are incompatible with each other and cannot be compared because there is no common format available. For example, conventional computers are unable to compare data samples of images with data samples of audio samples because there is no common format available. In contrast, a device implementing a correlithm object processing system uses a combination of a sensor table 308, a node table 200, and/or an actor table 310 to compare and perform operations using correlithm objects 104 in the correlithm object domain regardless of the type or format of the original data samples. The correlithm object processing system 300 uses a combination of a sensor table 308, a node table 200, and/or an actor table 310 as a specific set of rules that provides a particular solution to dealing with different types of data samples and allows devices to perform operations on different types of data samples using correlithm objects 104 in the correlithm object domain. In some instances, comparing data samples as correlithm objects 104 is computationally more efficient and faster than comparing data samples in their original format. Thus, using correlithm objects 104 to represent data samples provides increased flexibility and improved performance compared to using other conventional data structures. The specific set of rules used by the correlithm object processing system 300 go beyond simply using routine and conventional activities in order to achieve this new functionality and performance improvements.

In addition, correlithm object processing system 300 uses a combination of a sensor table 308, a node table 200, and/or an actor table 310 to provide a particular manner for transforming data samples between ordinal number representations and correlithm objects 104 in a correlithm object domain. For example, the correlithm object processing system 300 may be configured to transform a representation of a data sample into a correlithm object 104, to perform various operations using the correlithm object 104 in the correlithm object domain, and to transform a resulting correlithm object 104 into another representation of a data sample. Transforming data samples between ordinal number representations and correlithm objects 104 involves fundamentally changing the data type of data samples between an ordinal number system and a categorical number system to achieve the previously described benefits of the correlithm object processing system 300.

Figure 4:
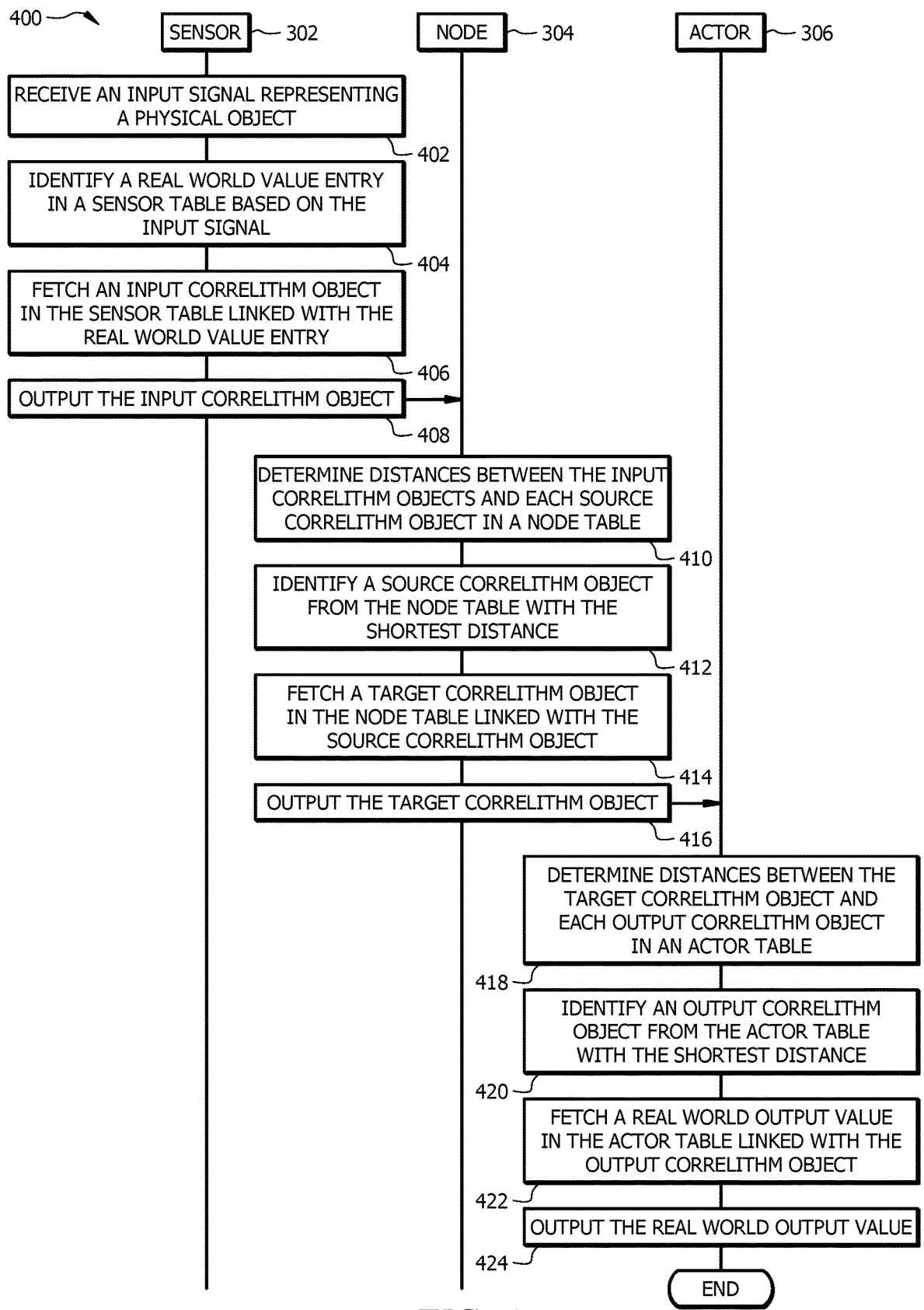
FIG. 4 is a protocol diagram of an embodiment of a correlithm object process flow.

FIG. 4 is a protocol diagram of an embodiment of a correlithm object process flow 400. A user device 100 implements process flow 400 to emulate a correlithm object processing system 300 to perform operations using correlithm object 104 such as facial recognition. The user device 100 implements process flow 400 to compare different data samples (e.g. images, voice signals, or text) are to each other and to identify other objects based on the comparison. Process flow 400 provides instructions that allows user devices 100 to achieve the improved technical benefits of a correlithm object processing system 300.

Conventional systems are configured to use ordinal numbers for identifying different data samples. Ordinal based number systems only provide information about the sequence order of numbers based on their numeric values, and do not provide any information about any other types of relationships for the data samples being represented by the numeric values such as similarity. In contrast, a user device 100 can implement or emulate the correlithm object processing system 300 which provides an unconventional solution that uses categorical numbers and correlithm objects 104 to represent data samples. For example, the system 300 may be configured to use binary integers as categorical numbers to generate correlithm objects 104 which enables the user device 100 to perform operations directly based on similarities between different data samples. Categorical numbers provide information about how similar different data sample are from each other. Correlithm objects 104 generated using categorical numbers can be used directly by the system 300 for determining how similar different data samples are from each other without relying on exact matches, having a common data type or format, or conventional signal processing techniques.

A non-limiting example is provided to illustrate how the user device 100 implements process flow 400 to emulate a correlithm object processing system 300 to perform facial recognition on an image to determine the identity of the person in the image. In other examples, the user device 100 may implement process flow 400 to emulate a correlithm object processing system 300 to perform voice recognition, text recognition, or any other operation that compares different objects.

At step 402, a sensor 302 receives an input signal representing a data sample. For example, the sensor 302 receives an image of person's face as a real world input value 320. The input signal may be in any suitable data type or format. In one embodiment, the sensor 302 may obtain the input signal in real-time from a peripheral device (e.g. a camera). In another embodiment, the sensor 302 may obtain the input signal from a memory or database.

At step 404, the sensor 302 identifies a real world value entry in a sensor table 308 based on the input signal. In one embodiment, the system 300 identifies a real world value entry in the sensor table 308 that matches the input signal. For example, the real world value entries may comprise previously stored images. The sensor 302 may compare the received image to the previously stored images to identify a real world value entry that matches the received image. In one embodiment, when the sensor 302 does not find an exact match, the sensor 302 finds a real world value entry that closest matches the received image.

At step 406, the sensor 302 identifies and fetches an input correlithm object 104 in the sensor table 308 linked with the real world value entry. At step 408, the sensor 302 sends the identified input correlithm object 104 to the node 304. In one embodiment, the identified input correlithm object 104 is represented in the sensor table 308 using a categorical binary integer string. The sensor 302 sends the binary string representing to the identified input correlithm object 104 to the node 304.

At step 410, the node 304 receives the input correlithm object 104 and determines distances 106 between the input correlithm object 104 and each source correlithm object 104 in a node table 200. In one embodiment, the distance 106 between two correlithm objects 104 can be determined based on the differences between the bits of the two correlithm objects 104. In other words, the distance 106 between two correlithm objects can be determined based on how many individual bits differ between a pair of correlithm objects 104. The distance 106 between two correlithm objects 104 can be computed using hamming distance or any other suitable technique. In another embodiment, the distance 106 between two correlithm objects 104 can be determined using a Minkowski distance such as the Euclidean or "straight-line" distance between the correlithm objects 104. For example, the distance 106 between a pair of correlithm objects 104 may be determined by calculating the square root of the sum of squares of the coordinate difference in each dimension.

At step 412, the node 304 identifies a source correlithm object 104 from the node table 200 with the shortest distance 106. A source correlithm object 104 with the shortest distance from the input correlithm object 104 is a correlithm object 104 either matches or most closely matches the received input correlithm object 104.

At step 414, the node 304 identifies and fetches a target correlithm object 104 in the node table 200 linked with the source correlithm object 104. At step 416, the node 304 outputs the identified target correlithm object 104 to the actor 306. In this example, the identified target correlithm object 104 is represented in the node table 200 using a categorical binary integer string. The node 304 sends the binary string representing to the identified target correlithm object 104 to the actor 306.

At step 418, the actor 306 receives the target correlithm object 104 and determines distances between the target correlithm object 104 and each output correlithm object 104 in an actor table 310. The actor 306 may compute the distances between the target correlithm object 104 and each output correlithm object 104 in an actor table 310 using a process similar to the process described in step 410.

At step 420, the actor 306 identifies an output correlithm object 104 from the actor table 310 with the shortest distance 106. An output correlithm object 104 with the shortest distance from the target correlithm object 104 is a correlithm object 104 either matches or most closely matches the received target correlithm object 104.

At step 422, the actor 306 identifies and fetches a real world output value in the actor table 310 linked with the output correlithm object 104. The real world output value may be any suitable type of data sample that corresponds with the original input signal. For example, the real world output value may be text that indicates the name of the person in the image or some other identifier associated with the person in the image. As another example, the real world output value may be an audio signal or sample of the name of the person in the image. In other examples, the real world output value may be any other suitable real world signal or value that corresponds with the original input signal. The real world output value may be in any suitable data type or format.

At step 424, the actor 306 outputs the identified real world output value. In one embodiment, the actor 306 may output the real world output value in real-time to a peripheral device (e.g. a display or a speaker). In one embodiment, the actor 306 may output the real world output value to a memory or database. In one embodiment, the real world output value is sent to another sensor 302. For example, the real world output value may be sent to another sensor 302 as an input for another process.

Figure 5:
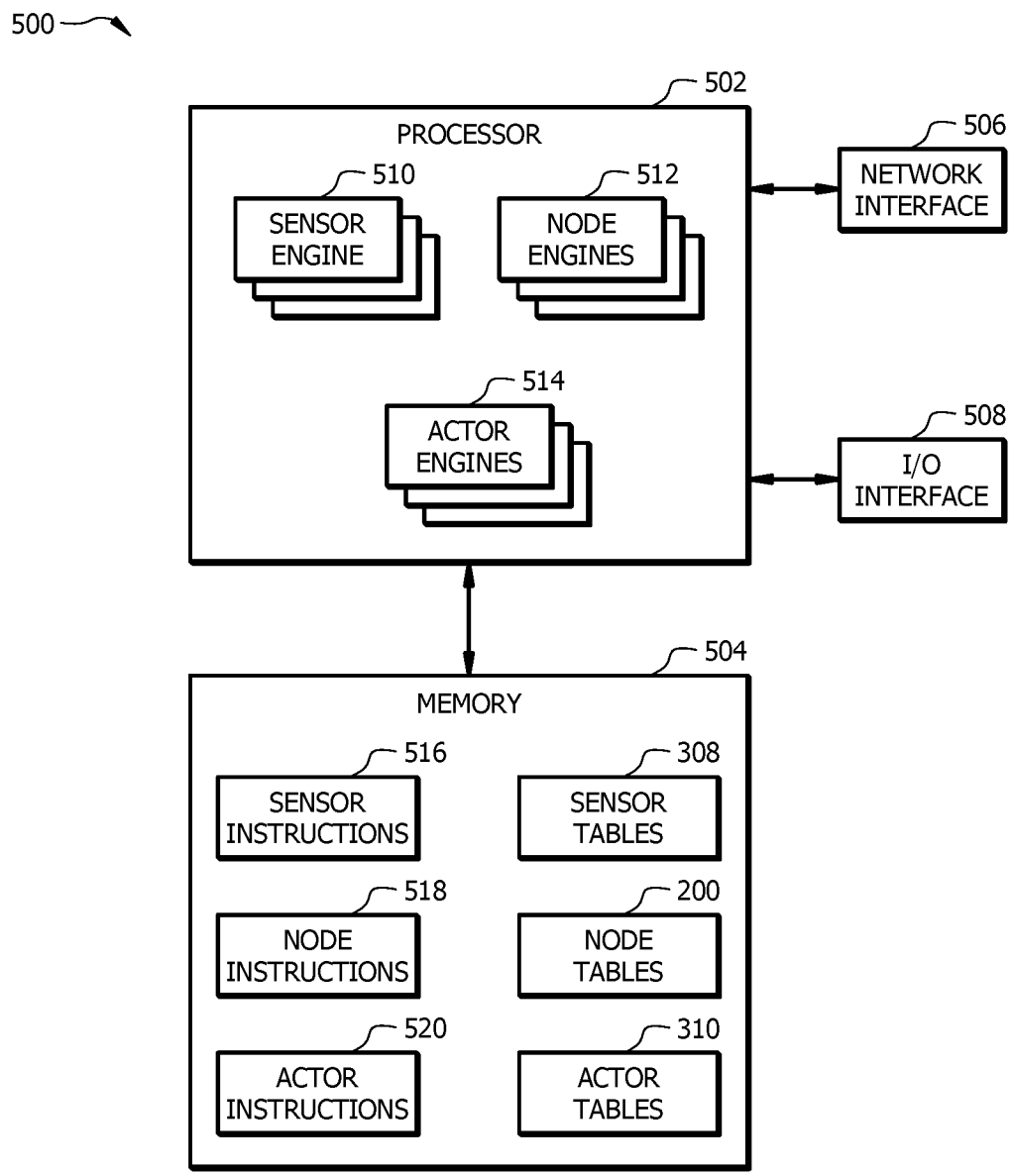
FIG. 5 is a schematic diagram of an embodiment a computer architecture for emulating a correlithm object processing system.

FIG. 5 is a schematic diagram of an embodiment a computer architecture 500 for emulating a correlithm object processing system 300 in a user device 100. The computer architecture 500 comprises a processor 502, a memory 504, a network interface 506, and an input-output (I/O) interface 508. The computer architecture 500 may be configured as shown or in any other suitable configuration.

The processor 502 comprises one or more processors operably coupled to the memory 504. The processor 502 is any electronic circuitry including, but not limited to, state machines, one or more central processing unit (CPU) chips, logic units, cores (e.g. a multi-core processor), field-programmable gate array (FPGAs), application specific integrated circuits (ASICs), graphics processing units (GPUs), or digital signal processors (DSPs). The processor 502 may be a programmable logic device, a microcontroller, a microprocessor, or any suitable combination of the preceding. The processor 502 is communicatively coupled to and in signal communication with the memory 204. The one or more processors are configured to process data and may be implemented in hardware or software. For example, the processor 502 may be 8-bit, 16-bit, 32-bit, 64-bit or of any other suitable architecture. The processor 502 may include an arithmetic logic unit (ALU) for performing arithmetic and logic operations, processor registers that supply operands to the ALU and store the results of ALU operations, and a control unit that fetches instructions from memory and executes them by directing the coordinated operations of the ALU, registers and other components.

The one or more processors are configured to implement various instructions. For example, the one or more processors are configured to execute instructions to implement sensor engines 510, node engines 512, and actor engines 514. In an embodiment, the sensor engines 510, the node engines 512, and the actor engines 514 are implemented using logic units, FPGAs, ASICs, DSPs, or any other suitable hardware. The sensor engines 510, the node engines 512, and the actor engines 514 are each configured to implement a specific set of rules or process that provides an improved technological result.

In one embodiment, the sensor engine 510 is configured to receive a real world value 320 as an input, to determine a correlithm object 104 based on the real world value 320, and to output the correlithm object 104. Examples of the sensor engine 510 in operation are described in FIGS. 4 and 11.

In one embodiment, the node engine 512 is configured to receive a correlithm object 104 (e.g. an input correlithm object 104), to determine another correlithm object 104 based on the received correlithm object 104, and to output the identified correlithm object 104 (e.g. an output correlithm object 104). The node engine 512 is also configured to compute distances between pairs of correlithm objects 104. Examples of the node engine 512 in operation are described in FIGS. 4, 6-12, 14, 15A, 15B, and 18.

In one embodiment, the actor engine 514 is configured to receive a correlithm object 104 (e.g. an output correlithm object 104), to determine a real world output value 326 based on the received correlithm object 104, and to output the real world output value 326. Examples of the actor engine 514 in operation are described in FIGS. 4 and 11.

The memory 504 comprises one or more non-transitory disks, tape drives, or solid-state drives, and may be used as an over-flow data storage device, to store programs when such programs are selected for execution, and to store instructions and data that are read during program execution. The memory 504 may be volatile or non-volatile and may comprise read-only memory (ROM), random-access memory (RAM), ternary content-addressable memory (TCAM), dynamic random-access memory (DRAM), and static random-access memory (SRAM). The memory 504 is operable to store sensor instructions 516, node instructions 518, actor instructions 520, sensor tables 308, node tables 200, actor tables 310, and/or any other data or instructions. The sensor instructions 516, the node instructions 518, and the actor instructions 520 comprise any suitable set of instructions, logic, rules, or code operable to execute the sensor engine 510, node engine 512, and the actor engine 514, respectively.

The sensor tables 308, the node tables 200, and the actor tables 310 may be configured similar to the sensor tables 308, the node tables 200, and the actor tables 310 described in FIG. 3, respectively.

The network interface 506 is configured to enable wired and/or wireless communications. The network interface 506 is configured to communicate data with any other device or system. For example, the network interface 506 may be configured for communication with a modem, a switch, a router, a bridge, a server, or a client. The processor 502 is configured to send and receive data using the network interface 506.

The I/O interface 508 may comprise ports, transmitters, receivers, transceivers, or any other devices for transmitting and/or receiving data with peripheral devices as would be appreciated by one of ordinary skill in the art upon viewing this disclosure. For example, the I/O interface 508 may be configured to communicate data between the processor 502 and peripheral hardware such as a graphical user interface, a display, a mouse, a keyboard, a key pad, and a touch sensor (e.g. a touch screen).

Figure 6:
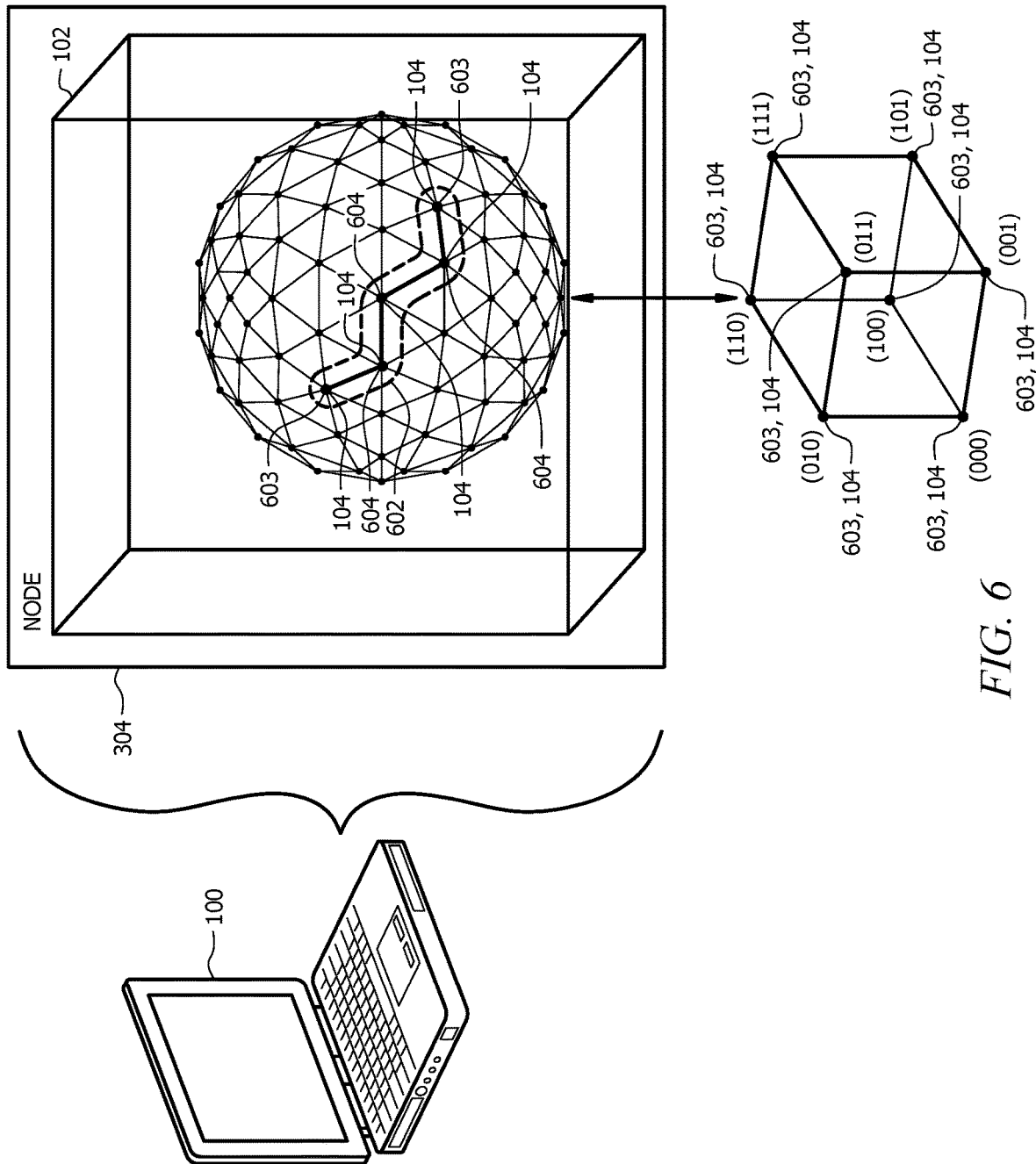
FIG. 6 is a schematic diagram of an embodiment of a device implementing string correlithm objects for a correlithm object processing system.
Figure 7:
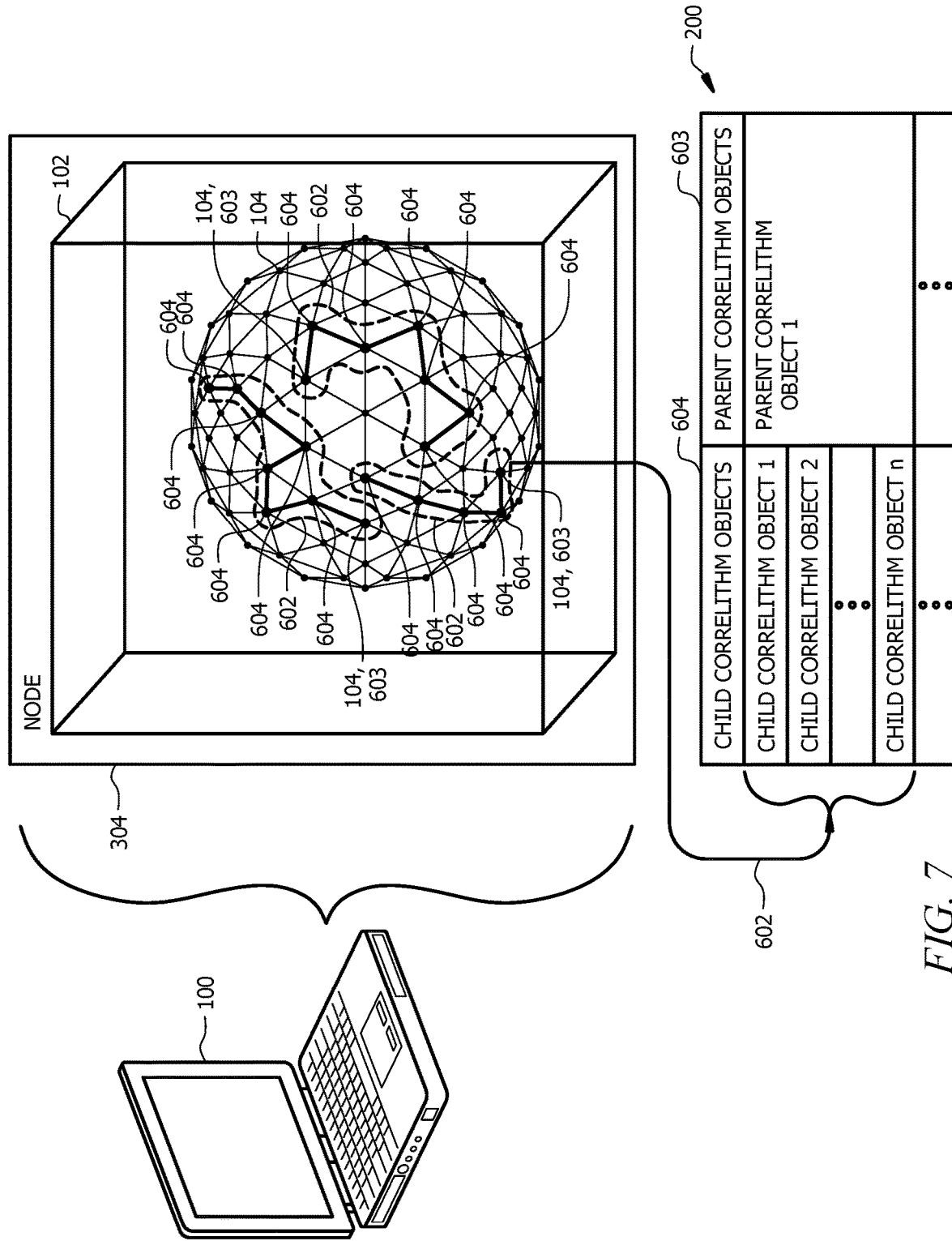
FIG. 7 is a schematic diagram of another embodiment of a device implementing string correlithm objects for a correlithm object processing system.
Figure 8:
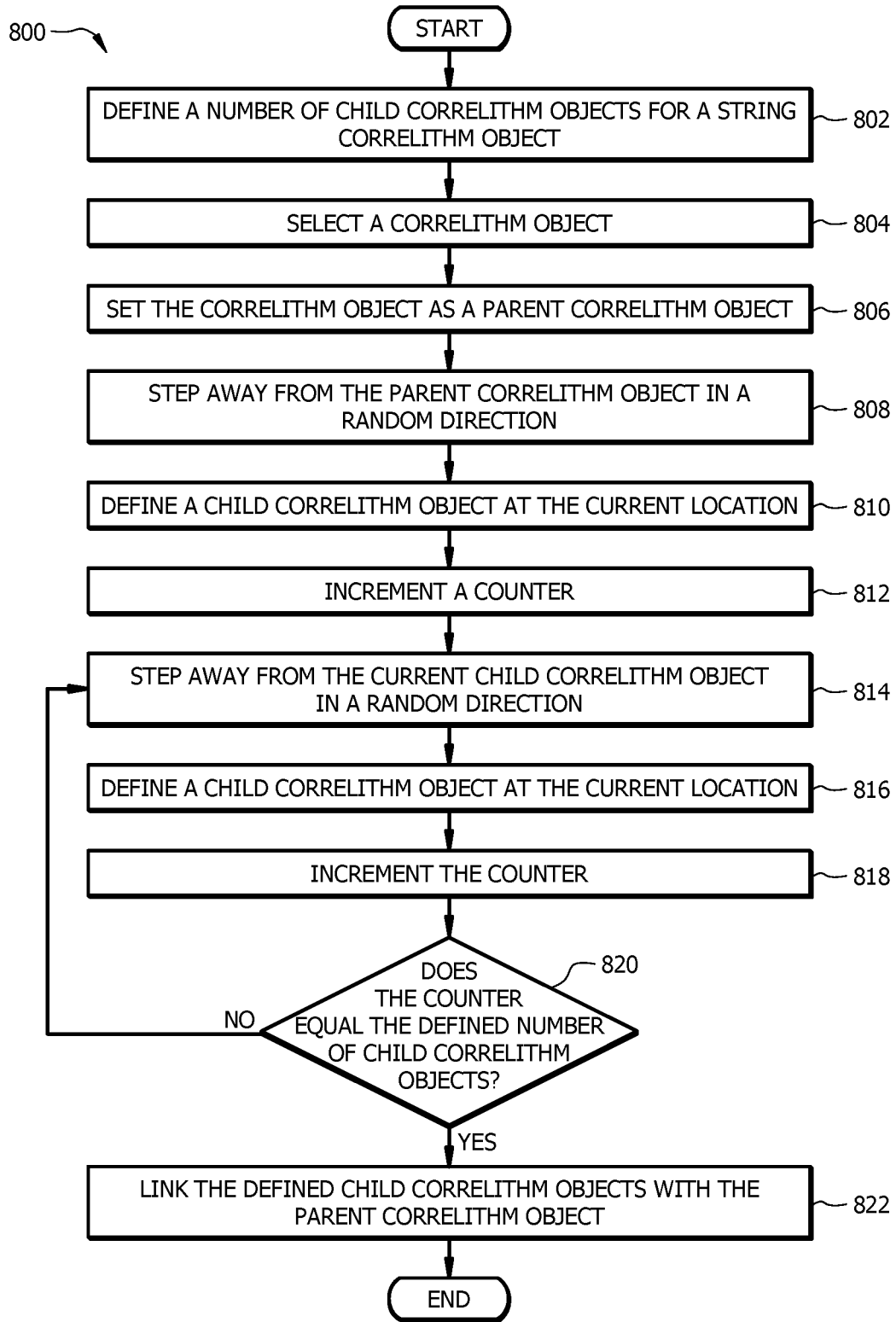
FIG. 8 is a flowchart of an embodiment of a process for emulating string correlithm objects for a correlithm object processing system.
Figure 9:
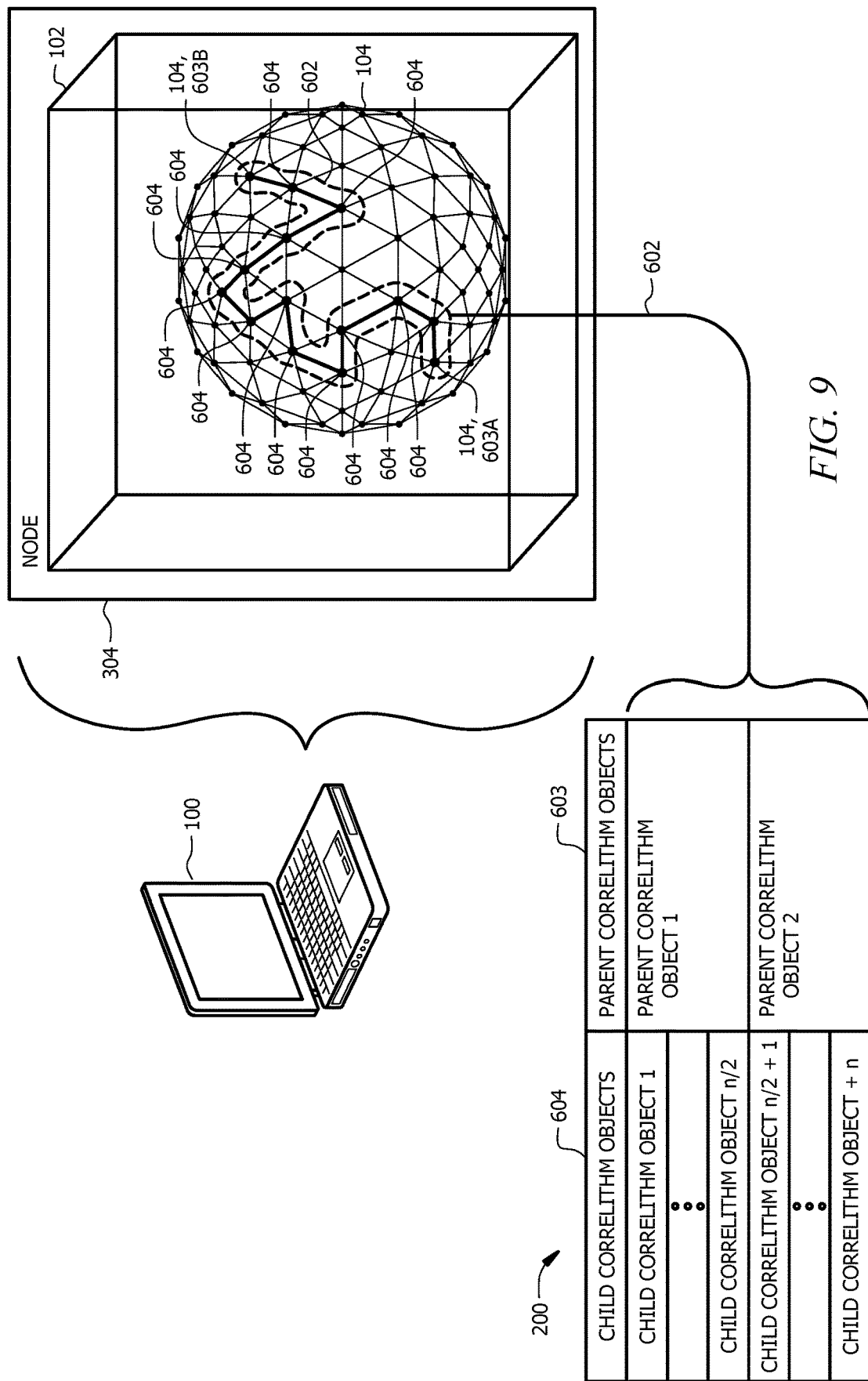
FIG. 9 is a schematic diagram of another embodiment of a device implementing string correlithm objects for a correlithm object processing system.
Figure 10:
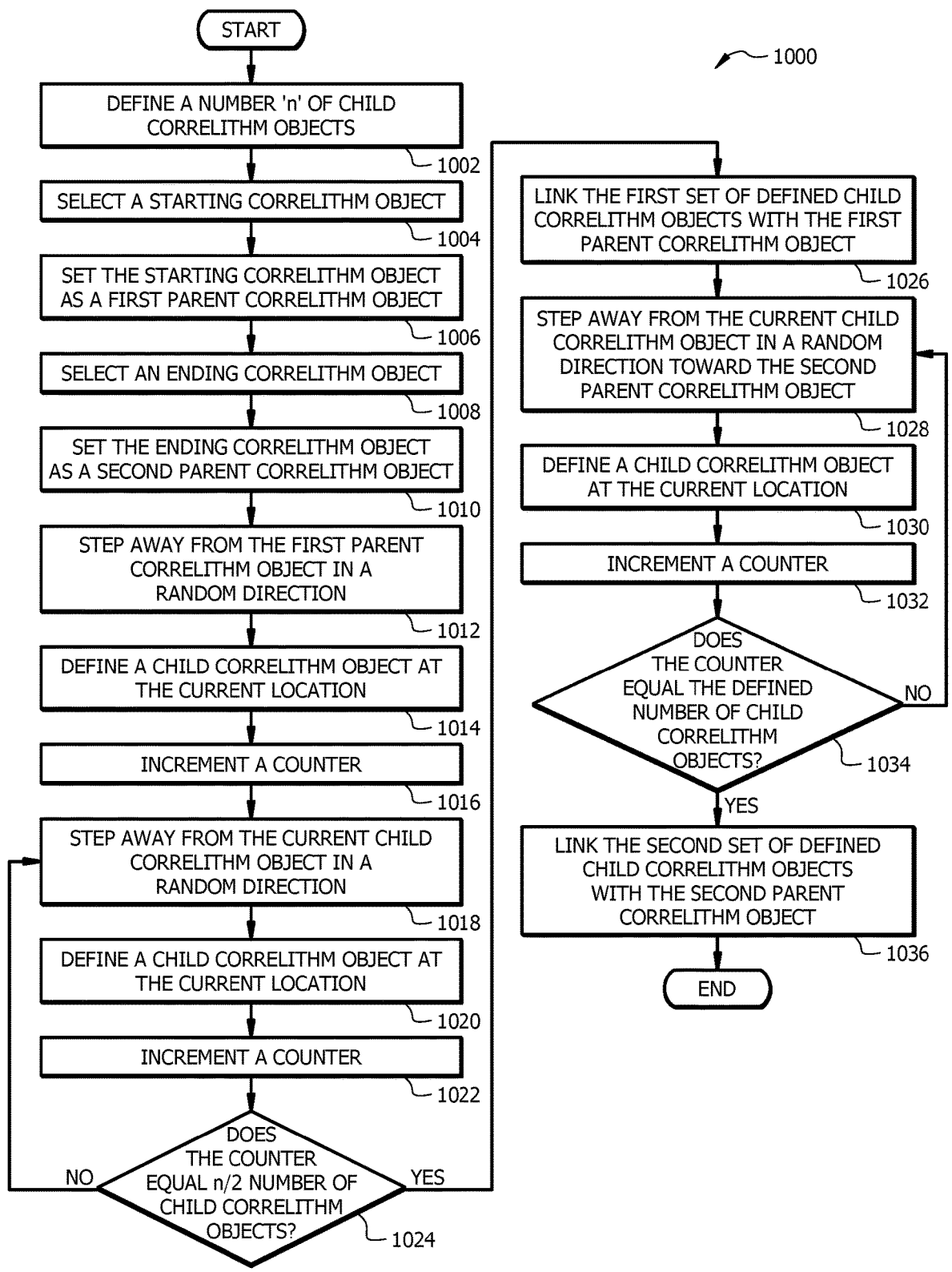
FIG. 10 is a flowchart of another embodiment of a process for emulating string correlithm objects for a correlithm object processing system.

FIGS. 6-10 generally describe how a string correlithm object may be implemented in a correlithm object processing system 300 using a device 100. FIG. 6 describes how a string correlithm object embeds different orders of correlithm objects 104 with each other. FIGS. 7 and 8 combine to describe an embodiment for emulating a string correlithm object in a correlithm object processing system 300 with a device 100. FIGS. 9 and 10 combine to describe another embodiment for emulating a string correlithm object in a correlithm object processing system 300 with a device 100.

FIGS. 6 and 7 are schematic diagrams of an embodiment of a device 100 implementing string correlithm objects 602 for a correlithm object processing system 300. String correlithm objects 602 can be used by a correlithm object processing system 300 to embed higher orders of correlithm objects 104 within lower orders of correlithm objects 104. The order of a correlithm object 104 depends on the number of bits used to represent the correlithm object 104. The order of a correlithm object 104 also corresponds with the number of dimensions in the n-dimensional space 102 where the correlithm object 104 is located. For example, a correlithm object 104 represented by a 64-bit string is a higher order correlithm object 104 than a correlithm object 104 represented by 16-bit string.

Conventional computing systems rely on accurate data input and are unable to detect or correct for data input errors in real time. For example, a conventional computing device assumes a data stream is correct even when the data stream has bit errors. When a bit error occurs that leads to an unknown data value, the conventional computing device is unable to resolve the error without manual intervention. In contrast, string correlithm objects 602 enable a device 100 to perform operations such as error correction and interpolation within the correlithm object processing system 300. For example, higher order correlithm objects 104 can be used to associate an input correlithm object 104 with a lower order correlithm 104 when an input correlithm object does not correspond with a particular correlithm object 104 in an n-dimensional space 102. The correlithm object processing system 300 uses the embedded higher order correlithm objects 104 to define correlithm objects 104 between the lower order correlithm objects 104 which allows the device 100 to identify a correlithm object 104 in the lower order correlithm objects n-dimensional space 102 that corresponds with the input correlithm object 104. Using string correlithm objects 602, the correlithm object processing system 300 is able to interpolate and/or to compensate for errors (e.g. bit errors) which improve the functionality of the correlithm object processing system 300 and the operation of the device 100.

In some instances, string correlithm objects 602 may be used to represent a series of data samples or temporal data samples. For example, a string correlithm object 602 may be used to represent audio or video segments. In this example, media segments are represented by sequential correlithm objects that are linked together using a string correlithm object 602.

FIG. 6 illustrates an embodiment of how a string correlithm object 602 may be implemented within a node 304 by a device 100. In other embodiments, string correlithm objects 602 may be integrated within a sensor 302 or an actor 306. In 32-dimensional space 102 where correlithm objects 104 can be represented by a 32-bit string, the 32-bit string can be embedded and used to represent correlithm objects 104 in a lower order 3-dimensional space 102 which uses three bits. The 32-bit strings can be partitioned into three 12 bit portions, where each portion corresponds with one of the three bits in the 3-dimensional space 102. For example, the correlithm object 104 represented by the 3 bit binary value of 000 may be represented by a 32-bit binary string of zeros and the correlithm object represented by the binary value of 111 may be represented by a 32-bit string of all ones. As another example, the correlithm object 104 represented by the 3 bit binary value of 100 may be represented by a 32-bit binary string with 12 bits set to one followed by 24 bits set to zero. In other examples, string correlithm objects 602 can be used to embed any other combination and/or number of n-dimensional spaces 102.

In one embodiment, when a higher order n-dimensional space 102 is embedded in a lower order n-dimensional space 102, one or more correlithm objects 104 are present in both the lower order n-dimensional space 102 and the higher order n-dimensional space 102. Correlithm objects 104 that are present in both the lower order n-dimensional space 102 and the higher order n-dimensional space 102 may be referred to as parent correlithm objects 603. Correlithm objects 104 in the higher order n-dimensional space 102 may be referred to as child correlithm objects 604. In this example, the correlithm objects 104 in the 3-dimensional space 102 may be referred to as parent correlithm objects 603 while the correlithm objects 104 in the 32-dimensional space 102 may be referred to as child correlithm objects 604. In general, child correlithm objects 604 are represented by a higher order binary string than parent correlithm objects 603. In other words, the bit strings used to represent a child correlithm object 604 may have more bits than the bit strings used to represent a parent correlithm object 603. The distance between parent correlithm objects 603 may be referred to as a standard distance. The distance between child correlithm objects 604 and other child correlithm objects 604 or parent correlithm objects 603 may be referred to as a fractional distance which is less than the standard distance.

FIG. 7 illustrates another embodiment of how a string correlithm object 602 may be implemented within a node 304 by a device 100. In other embodiments, string correlithm objects 602 may be integrated within a sensor 302 or an actor 306. In FIG. 7, a set of correlithm objects 104 are shown within an n-dimensional space 102. In one embodiment, the correlithm objects 104 are equally spaced from adjacent correlithm objects 104. A string correlithm object 602 comprises a parent correlithm object 603 linked with one or more child correlithm objects 604. FIG. 7 illustrates three string correlithm objects 602 where each string correlithm object 602 comprises a parent correlithm object 603 linked with six child correlithm objects 603. In other examples, the n-dimensional space 102 may comprise any suitable number of correlithm objects 104 and/or string correlithm objects 602. An example of a process for generating a string correlithm object 602 is described in FIG. 8.

A parent correlithm object 603 may be a member of one or more string correlithm objects 602. For example, a parent correlithm object 603 may be linked with one or more sets child correlithm objects 604 in a node table 200. In one embodiment, a child correlithm object 604 may only be linked with one parent correlithm object 603. String correlithm objects 602 may be configured to form a daisy chain or a linear chain of child correlithm objects 604. In one embodiment, string correlithm objects 602 are configured such that child correlithm objects 604 do not form loops where the chain of child correlithm objects 604 intersect with themselves. Each child correlithm objects 604 is less than the standard distance away from its parent correlithm object 603. The child correlithm objects 604 are equally spaced from other adjacent child correlithm objects 604.

In one embodiment, a data structure such as node table 200 may be used to map or link parent correlithm objects 603 with child correlithm objects 604. The node table 200 is generally configured to identify a plurality of parent correlithm objects 603 and one or more child correlithm objects 604 linked with each of the parent correlithm objects 603. For example, node table 200 may be configured with a first column that lists child correlithm objects 604 and a second column that lists parent correlithm objects 603. In other examples, the node table 200 may be configured in any other suitable manner or may be implemented using any other suitable data structure. In some embodiments, one or more mapping functions may be used to convert between a child correlithm object 604 and a parent correlithm object 603.

FIG. 8 is a flowchart of an embodiment of a process 800 for emulating or generating string correlithm objects 602 for a correlithm object processing system 300. Process flow 800 provides instructions that allows the user device 100 to emulate or generate string correlithm object 602 in a node 304 which can be used by the correlithm object processing system 300 for applications that involve functions like error correction, interpolation, data compression, and quantization. In other embodiments, process 800 may be implemented by a sensor 302 or an actor 306. In some instances, the string correlithm objects 602 generated by process 800 may be referred to as drift-away string correlithm objects.

As previously described above, conventional computing systems rely on accurate data input and are unable to detect or correct for data input errors in real time. When a bit error occurs that leads to an unknown data value, the conventional computing device is unable to resolve the error without manual intervention. In contrast, string correlithm objects 602 enable a device 100 to perform operations such as error correction and interpolation within the correlithm object processing system 300.

A non-limiting example is provided to illustrate how the user device 100 implements process 800 to emulate or generate a string correlithm object 602 for a correlithm object processing system 300. Process flow 800 may applied or extended to a variety of applications which involve functions such as error correction, interpolation, data compression, and quantization.

At step 802, the node 304 defines a number of child correlithm objects 604 for a string correlithm object 602. For example, the node 304 may define a string correlithm object 602 as having 16 child correlithm objects 604 linked with a parent correlithm object 603. In other examples, the node 304 may define any suitable number of child correlithm objects 604 that will be used to form the sting correlithm object 602.

At step 804, the node 304 selects a correlithm object 104 in the n-dimensional space 102. The n-dimensional space 102 may be formed by a first n-dimensional space 102 that is embedded in a second n-dimensional space 102, where the first n-dimensional space 102 has a great number of dimensions than the second n-dimensional space 102. For example, the node 304 may randomly select a correlithm object 104. As another example, the node 304 may select a correlithm object 104 based on information provided (e.g. an identifier) by a user of the device 100. At step 806, the node 304 sets the selected correlithm object 104 as a parent correlithm object 603. In one embodiment, setting the correlithm object 104 as the parent correlithm object 603 comprises adding an entry in a node table 200 that identifies the selected correlithm object 104 as a parent correlithm object 603.

At step 808, the node 304 steps away from the parent correlithm object 603 in a random direction. For example, the node 304 may randomly select a correlithm object 104 that is less than the standard distance away from the parent correlithm object 603. In one embodiment, the node 304 may identify a random correlithm object 104 that is adjacent (e.g. one hop away) to the parent correlithm object 603. In another embodiment, the node 304 may identify a random correlithm object 104 that is more than one hop away from the parent correlithm object 603. For example, the node 304 may select a correlithm object 104 that is three hops away from the parent correlithm object 603. In other examples, the node 304 may select a correlithm object 104 that is any other suitable number of hops away from the parent correlithm object 603. At step 810, the node 304 defines a child correlithm object 604 at the current location of the randomly selected correlithm object 104. In one embodiment, defining the child correlithm object 604 comprises adding an entry in the node table 200 that identifies the child correlithm object 604. At step 812, the node 304 increments a counter. The node 304 increments the counter to keep track of how many child correlithm objects 604 have been identified and/or added to the node table 200. In one embodiment, the counter functionality may be performed internally by the node 304. In other embodiments, the node 304 may be connected to an external device that provides the counter functionality.

At step 814, the node 304 steps away from the current child correlithm object 604 in a random direction. The node 304 may step away from the current child correlithm object 604 to randomly select another adjacent correlithm object 104 using a process similar to process described in step 808. At step 816, the node 304 defines a child correlithm object 604 at the current location of the randomly selected correlithm object 104. The node 304 may define the child correlithm object 604 using a process similar to the process described in step 810. At step 818, the node 304 increments the counter in response to defining another child correlithm object 604 and/or adding another child correlithm object 604 to the node table 200.

At step 820, the node 304 determines whether the counter value equals the defined number of child correlithm objects 604. In other words, the node 304 uses the current counter value to determine whether the node 304 has identified the previously defined number of child correlithm objects 604 to form a string correlithm object 602. The node 304 returns to step 814 in response to determining that the counter value does not equal the defined number of child correlithm objects 604. In other words, the node 304 returns to step 814 to continue identifying additional child correlithm objects 604 until the defined number of child correlithm objects 604 has been achieved. The node 304 proceeds to step 822 in response to determining that the counter value equals the defined number of child correlithm objects 604. When the counter value equals the defined number of child correlithm objects 604, the node 304 has identified all of the child correlithm objects 604 that will be used to form the string correlithm object 602.

At step 822, the node 304 links the defined child correlithm object 604 with the parent correlithm object 603 to form the string correlithm object 602. In one embodiment, linking the defined child correlithm objects 604 with the parent correlithm object 603 comprises linking the identified child correlithm objects 604 with the parent correlithm object 603 in the node table 200. Process 800 may be repeated one or more times to generate additional string correlithm objects 602.

FIG. 9 is a schematic diagram of another embodiment of a device 100 implementing string correlithm objects 602 in a node 304 for a correlithm object processing system 300. Previously in FIG. 7, a string correlithm object 602 comprised of child correlithm objects 604 that are adjacent to a parent correlithm object 603. In FIG. 9, string correlithm objects 602 comprise one or more child correlithm objects 604 in between a pair of parent correlithm objects 603. In this configuration, the string correlithm object 602 initially diverges from a first parent correlithm object 603A and then later converges toward a second parent correlithm object 603B. This configuration allows the correlithm object processing system 300 to generate a string correlithm object 602 between a particular pair of parent correlithm objects 603. An example of a process for generating a string correlithm object 602 between a pair of parent correlithm objects 603 is described in FIG. 10.

The string correlithm objects described in FIG. 9 allow the device 100 to interpolate value between a specific pair of correlithm objects 104 (i.e. parent correlithm objects 603). In other words, these types of string correlithm objects 602 allow the device 100 to perform interpolation between a set of parent correlithm objects 603. Interpolation between a set of parent correlithm objects 603 enables the device 100 to perform operations such as quantization which convert between different orders of correlithm objects 104. An example of implementing a quantizer using string correlithm objects 602 is described in FIGS. 11 and 12.

In one embodiment, a data structure such as node table 200 may be used to map or link the parent correlithm objects 603 with their respective child correlithm objects 604. For example, node table 200 may be configured with a first column that lists child correlithm objects 604 and a second column that lists parent correlithm objects 603. In this example, a first portion of the child correlithm objects 604 is linked with the first parent correlithm object 603A and a second portion of the child correlithm objects 604 is linked with the second parent correlithm object 603B. In other examples, the node table 200 may be configured in any other suitable manner or may be implemented using any other suitable data structure. In some embodiments, one or more mapping functions may be used to convert between a child correlithm object 604 and a parent correlithm object 603.

FIG. 10 is a flowchart of another embodiment of a process 1000 for emulating string correlithm objects 602 for a correlithm object processing system 300. Process flow 1000 provides instructions that allows the device 100 to emulate or generate string correlithm objects 602 which can be used by the correlithm object processing system 300 for applications that in involve functions like error correction, interpolation, data compression, and quantization. In other embodiments, process 1000 may be implemented by a sensor 302 or an actor 306. In some instances, the string correlithm object 602 generated by process 1000 may be referred to as drift-between string correlithm objects.

Process 1000 adds to the previously described benefits of using string correlithm objects 602 over conventional computing systems by providing the ability to generate string correlithm objects 602 between a specified set of parent correlithm objects 603. This process enables the device 100 to perform interpolation between a set of parent correlithm objects 603. Interpolation between a set of parent correlithm objects 603 enables the device 100 to perform operations such as quantization or compression to convert between different orders of correlithm objects 104.

A non-limiting example is provided to illustrate how the device 100 implements process flow 1000 to emulate or generate a string correlithm object 602 for a correlithm object processing system 300. Process 1000 may applied or extended to a variety of applications which involve functions such as error correction, interpolation, data compression, and quantization.

At step 1002, the node 304 defines a number 'n' of child correlithm objects 604 for a string correlithm object 602. For example, the node 304 may define a string correlithm object 602 as having 20 child correlithm objects 604 linked with a parent correlithm object 603. In other examples, the node 304 may define any suitable number of child correlithm objects 604 that will be used to form the sting correlithm object 602. In this example, the number 'n' of child correlithm objects 604 defines the number of correlithm objects 104 between a pair of parent correlithm objects 603. The number 'n' of child correlithm objects 604 is divided such that a first portion (e.g. half) of the child correlithm objects 604 are linked with a first parent correlithm object 603 and a second portion (e.g. half) of child correlithm objects 604 are linked with a second parent correlithm object 603.

At step 1004, the node 304 selects a starting correlithm object 104 in an n-dimensional space 102. The n-dimensional space 102 may be formed by a first n-dimensional space 102 that is embedded in a second n-dimensional space 102, where the first n-dimensional space 102 has a great number of dimensions than the second n-dimensional space 102. For example, the node 304 may randomly select a correlithm object 104. As another example, the node 304 may select a correlithm object 104 based on information provided (e.g. an identifier) by a user of the device 100. At step 1006, the node 304 sets the starting correlithm object 104 as a first parent correlithm object 603. In one embodiment, setting the correlithm object 104 as the first parent correlithm object 603 comprises adding an entry in a node table 200 that identifies the selected correlithm object 104 as the first parent correlithm object 603.

At step 1008, the node 304 selects an ending correlithm object 104 in the n-dimensional space 102. For example, the node 304 may randomly select a correlithm object 104. As another example, the node 304 may select a correlithm object 104 based on information provided (e.g. an identifier) by the user of the device 100. At step 1010, the node 304 sets the ending correlithm object 104 as a second parent correlithm object 603. In one embodiment, setting the correlithm object 104 as the second parent correlithm object 603 comprises adding an entry in a node table 200 that identifies the selected correlithm object 104 as the second parent correlithm object 603.

At step 1012, the node 304 steps away from the first parent correlithm object 603 in a random direction. For example, the node 304 may randomly select a correlithm object 104 that is less than the standard distance away from the first parent correlithm object 603. In one embodiment, the node 304 may identify a random correlithm object 104 that is adjacent (e.g. one hop away) to the first parent correlithm object 603. In another embodiment, the node 304 may identify a random correlithm objects that is more than one hop away from the first parent correlithm object 603. For example, the node 304 may select a correlithm object that is two hops away from the first parent correlithm object 603. In other examples, the node 304 may select a correlithm object 104 that is any other suitable number of hops away from the first parent correlithm object 603.

At step 1014, the node 304 defines a child correlithm object 604 at the current location of the randomly selected correlithm object 104. In one embodiment, defining the child correlithm object 604 comprises adding an entry in the node table 200 that identifies the child correlithm object 604.

At step 1016, the node 304 increments a counter. The node 304 increments the counter to keep track of how many child correlithm objects 604 have been identified and/or added to the node table 200. In one embodiment, the counter functionality may be performed internally by the node 304. In other embodiments, the node 304 may be connected to an external device that provides the counter functionality.

At step 1018, the node 304 steps away from the current child correlithm object in a random direction. The node 304 may step away from the current child correlithm object 604 to randomly select another correlithm object 104 using a process similar to process described in step 1012. At step 1020, the node 304 defines a child correlithm object at the current location. The node 304 may define the child correlithm object 604 using a process similar to the process described in step 1014. At step 1022, the node 304 increments the counter in response to defining another child correlithm object 604 and/or adding another child correlithm object 604 to the node table 200.

At step 1024, the node 304 determines whether the counter value equals half the defined number of child correlithm objects 604. In this example, the node 304 links a first portion (e.g. half) of the child correlithm objects 604 with the first parent correlithm object 603. The node 304 uses the current counter value to determine whether the node 304 has identified half of the previously defined number of child correlithm objects 604 to form a string correlithm object 602. The node 304 returns to step 1018 in response to determining that the counter value does not equal half the defined number of child correlithm objects 604. In other words, the node 304 returns to step 1018 to continue identifying additional child correlithm objects 604 until half the defined number of child correlithm objects 604 has been identified. The node 304 proceeds to step 1026 in response to determining that the counter value equals half the defined number of child correlithm objects 604.

At step 1026, the node 304 links the first set of defined child correlithm objects 604 with the first parent correlithm object 603. In one embodiment, linking the first set of defined child correlithm objects 604 with the first parent correlithm object 603 comprises linking the first set of defined child correlithm objects 604 with the first parent correlithm object 603 in the node table 200.

At step 1028, the node 304 steps away from the current child correlithm object 604 in a random direction towards the second parent correlithm object 603. The node 304 may step away from the current child correlithm object 604 to randomly select another correlithm object 104 using a process similar to process described in step 1012. At step 1030, the node 304 defines a child correlithm object at the current location. The node 304 may define the child correlithm object 604 using a process similar to the process described in step 1014. At step 1032, the node 304 increments the counter in response to defining another child correlithm object 604 and/or adding another child correlithm object 604 to the node table 200.

At step 1034, the node 304 determines whether the counter value equals the defined number of child correlithm objects 604. In this example, the node 304 links a second portion (e.g. half) of the child correlithm objects 604 with the second parent correlithm object 603. The node 304 uses the current counter value to determine whether the node 304 has identified the second half of the previously defined number of child correlithm objects 604 to form a string correlithm object 602. The node 304 returns to step 1028 in response to determining that the counter value does not equal the defined number of child correlithm objects 604. In other words, the node 304 returns to step 1028 to continue identifying child correlithm objects 604 until the defined number of child correlithm objects 604 has been identified. The node 304 proceeds to step 1036 in response to determining that the counter value equals the defined number of child correlithm objects 604.

At step 1036, the node 304 links the second set of defined child correlithm objects 604 with the second parent correlithm object 603. In one embodiment, linking the second set of defined child correlithm objects 604 with the second parent correlithm object 603 comprises linking the second set of defined child correlithm objects 604 with the second parent correlithm object 603 in the node table 200.

Figure 11:
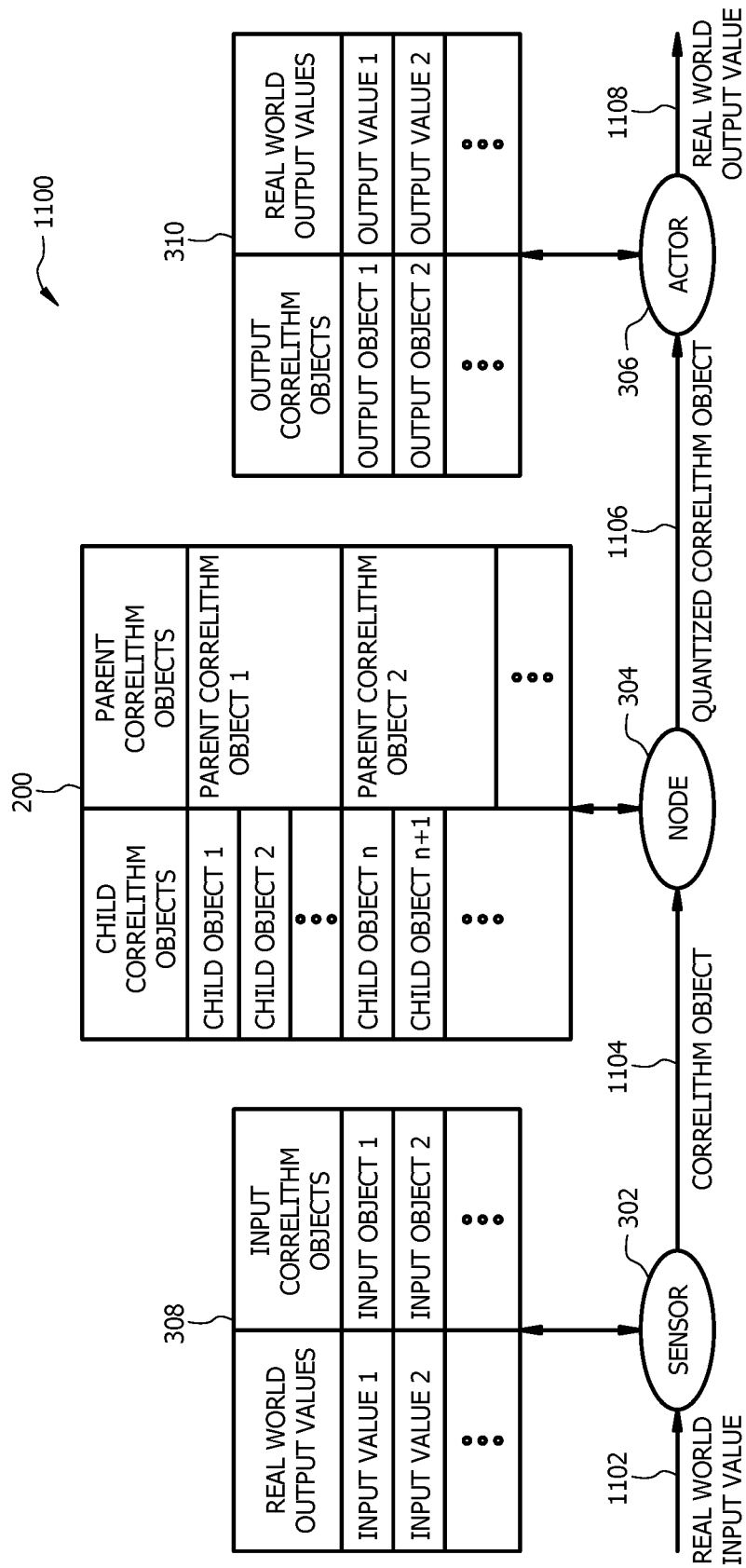
FIG. 11 is a schematic diagram of an embodiment of a quantizer for a correlithm object processing system.
Figure 12:
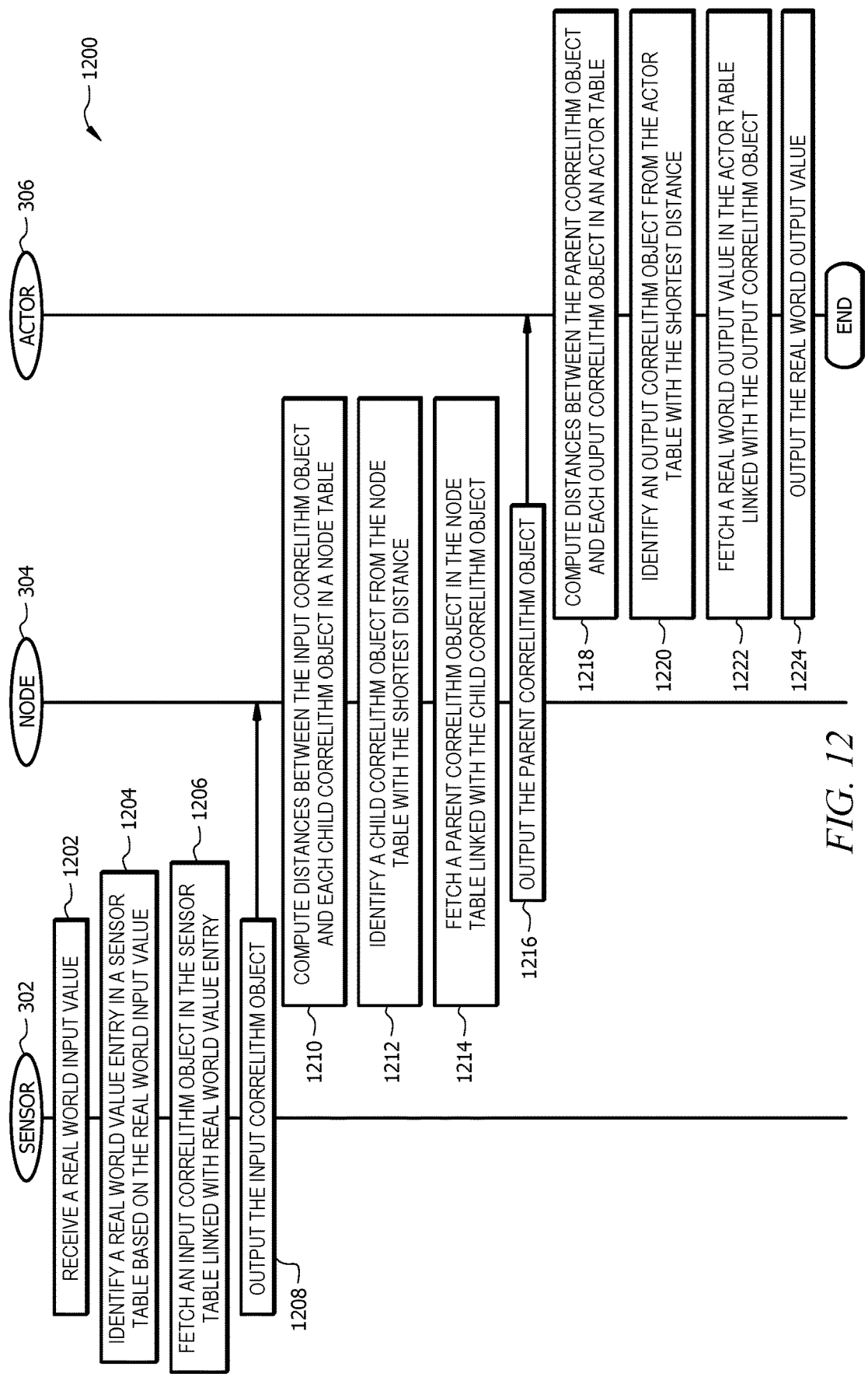
FIG. 12 is a flowchart of another embodiment of a process for emulating a quantizer for a correlithm object processing system.

FIGS. 11 and 12 combine to describe an embodiment for emulating a quantizer using string correlithm objects 602 in a correlithm object processing system 300 with a device 100.

FIG. 11 is a schematic diagram of an embodiment of a quantizer 1100 for a correlithm object processing system 300 that is implemented by a user device 100. Conventional computing devices typically performs data compression to reduce the size of data. The data compression process is specific to the type of data being compressed. For example, down sampling images require a particular process which is different from the process used to compress audio samples or music samples. Because every type of data requires a different type of data compression process, conventional computing devices have to be preconfigured to perform data compression on data types the device expects to handle. The number of different types of data may be prohibitive for conventional computing devices to be configured to perform data compression on all types of data. For each type of data compression process a conventional computing device is configured to handle, the device requires additional resources (e.g. memory) and the complexity of configuring the device increases.

In contrast, a device 100 is can be configured to implement a quantizer 1100 that enables to device to perform data compression or quantization regardless of the data type of the original data sample. The quantizer 1100 is able to convert higher order correlithm objects 104 into lower order correlithm objects 104 and vice-versa. By converting from a higher order correlithm object 104 to a lower correlithm object 104 the node 304 is able to represent data samples using fewer bits. Because the quantizer 1100 operates in the correlithm object domain, the quantizer 1100 is agnostic to different data types. This means that the device 100 is able to perform data compression without using different data compression processes for every type of data. This reduces the overall complexity of the device configuration and reduces the amount of resources (e.g. memory and processing time) necessary to perform data compression.

The quantizer 1100 generally comprises a sensor 302, a node 304, and an actor 306. The quantizer 1100 may be configured with any suitable number and/or configuration of sensors 302, nodes 304, and actors 306. An example of the quantizer 1100 in operation is described in FIG. 12. In one embodiment, a sensor 302, a node 304, and an actor 306 may all be implemented on the same device (e.g. user device 100). In other embodiments, a sensor 302, a node 304, and an actor 306 may each be implemented on different devices in signal communication with each other for example over a network. In other embodiments, different devices may be configured to implement any combination of sensors 302, nodes 304, and actors 306.

The sensor 302 is configured as an interface that allows the user device 100 to convert real world data samples into correlithm objects 104 that can be used in the correlithm object domain. The sensor 302 is configured to receive a real world value 1102 representing a data sample as an input, to determine a correlithm object 104 based on the real world value 1102, and to output the correlithm object 104. For example, the sensor 302 may receive an image of a person and output a correlithm object 1104 to the node 304 or actor 306. In one embodiment, the sensor 302 is configured to use sensor tables 308 that link a plurality of real world values with a plurality of correlithm objects 104 in an n-dimensional space 102. In other examples, sensor tables 308 may be configured in any other suitable manner or may be implemented using any other suitable data structure. In some embodiments, one or more mapping functions may be used to translate between a real world value and a correlithm object 104 is a n-dimensional space 102.

The node 304 is configured to receive a child correlithm object 604 (e.g. correlithm object 1104), to determine a parent correlithm object 603 based on the received child correlithm object 604, and to output the identified parent correlithm object 603 (e.g. correlithm object 1106). The node 304 is configured to use a node table 200 with string correlithm objects 602 that link child correlithm objects 604 with their respective parent correlithm objects 603. The node table 200 may be configured similar to the node table 200 described in FIGS. 7 and 9. By using a node table 200 that comprises string correlithm objects 602, the node 304 is able to convert between different orders of correlithm objects 104. In other words, the node 304 is able to perform quantization or data compression by converting higher order correlithm objects 104 into lower order correlithm objects 104 and vice-versa. By converting from a higher order correlithm object 104 to a lower correlithm object 104 the node 304 is able to represent data samples using fewer bits.

The actor 306 serves as an interface that allows the user device 100 to convert correlithm objects 104 in the correlithm object domain back to real world values or data samples. The actor 306 is configured receive a correlithm object 104 (e.g. quantized correlithm object 1106), to determine a real world output value 1108 based on the received correlithm object 104, and to output the real world output value 1108. The real world output value 1108 is a quantized representation of the original real world input value 1102. In other words, the real world output value 1108 may use fewer bits to represent the original real world input value 1102. In some embodiments, the real world output value 1108 may be a different type or representation of the original data sample. In one embodiment, the actor 306 is configured to use actor tables 310 that link a plurality of correlithm objects 104 in an n-dimensional space 102 with a plurality of real world values. As an example, an actor table 310 may be configured with a first column that lists correlithm objects 104 as output correlithm objects and a second column that lists real world values. In other examples, actor tables 310 may be configured in any other suitable manner or may be implemented using any other suitable data structure. In some embodiments, one or more mapping functions may be employed to translate between a correlithm object 104 in an n-dimensional space and a real world output value 1108.

FIG. 12 is a flowchart of another embodiment of a process 1200 for emulating a quantizer 1100 for a correlithm object processing system 300. A user device 100 implements process 1200 to perform quantization using correlithm objects 104. The user device 100 uses process 1200 to convert between different orders of correlithm objects 104. For example, the user device 100 may use process 1200 to convert between correlithm objects 104 in a 128-dimensional space 102 and correlithm objects 104 in a 64-dimensional space 102.

As previously described above, the quantizer 1100 operates in the correlithm object domain and is agnostic to different data types. This means that the device 100 emulating the quantizer 1100 is able to perform data compression without using different processes for every type of data. This reduces the overall complexity of the device configuration and reduces the amount of resources (e.g. memory and processing time) necessary to perform data compression compared to conventional computing systems.

A non-limiting example is provided to illustrate how the device 100 implements process 1200 to emulate a quantizer 1100 in a correlithm object processing system 300 to convert from high order correlithm objects 104 to lower order correlithm objects 104 which reduces the size of the bit strings that are used to represent the correlithm objects 104 and the data samples.

At step 1202, the sensor 302 receives a real world input value 1102. For example, the sensor 302 receives an image of person's face as a real world input value 1102. The real world input value 1102 may be in any suitable data type or format. In one embodiment, the sensor 302 may obtain the real world input value 1102 in real-time from a peripheral device (e.g. a camera). In another embodiment, the sensor 302 may obtain the real world input value 1102 from a memory or database.

At step 1204, the sensor 302 identifies a real world value entry in a sensor table 308 based on the real world input value 1102. In one embodiment, the system 300 identifies a real world value entry in the sensor table 308 that matches the real world input value 1102. For example, the real world value entries may comprise previously stored images. The sensor 302 may compare the received image to the previously stored images to identify a real world value entry that matches the received image. In one embodiment, when the sensor 302 does not find an exact match, the sensor 302 finds a real world value entry that closest matches the received image.

At step 1206, the sensor 302 identifies or fetches an input correlithm object 104 in the sensor table 308 linked with the real world value entry. At step 1208, the sensor 302 outputs the identified input correlithm object 104. In one embodiment, the identified input correlithm object 104 is represented in the sensor table 308 using a categorical binary integer string. The sensor 302 sends the binary string representing to the identified input correlithm object 104 to the node 304.

At step 1210, the node 304 computes distances between the input correlithm object 104 and each child correlithm object 604 in a node table 200. In one embodiment, the distance 106 between the input correlithm object 104 and a child correlithm object 604 can be determined based on the differences between the bits of the two correlithm objects. In other words, the distance 106 between the two correlithm objects can be determined based on how many individual bits differ between the pair of correlithm objects. The distance 106 between two correlithm objects 104 can be computed using hamming distance or any other suitable technique. In another embodiment, the distance 106 between two correlithm objects 104 can be determined using a Minkowski distance such as the Euclidean or "straight-line" distance between the correlithm objects 104. For example, the distance 106 between a pair of correlithm objects 104 may be determined by calculating the square root of the sum of squares of the coordinate difference in each dimension.

At step 1212, the node 304 identifies a child correlithm object 604 from the node table 200 with the shortest distance. A child correlithm object 604 with the shortest distance from the input correlithm object 104 is the correlithm object that either matches or most closely matches the received input correlithm object 104.

At step 1214, the node 304 identifies or fetches a parent correlithm object 603 in the node table 200 linked with the child correlithm object 604. At step 1216, the node 304 outputs the identified parent correlithm object 603. In this example, the identified parent correlithm object 603 is represented in the node table 200 using a categorical binary integer string. The node 304 sends the binary string representing to the identified parent correlithm object 603 to the actor 306.

At step 1218, the actor 306 computes the distance between the parent correlithm object 603 and each output correlithm object 104 in an actor table 310. The actor 306 may compute the distances between the parent correlithm object 603 and each output correlithm object 104 in an actor table 310 using a process similar to the process described in step 1210.

At step 1220, the actor 306 identifies an output correlithm object 104 from the actor table 310 with the shortest distance. An output correlithm object 104 with the shortest distance from the parent correlithm object 603 is the correlithm object 104 that either matches or most closely matches the received parent correlithm object 104.

At step 1222, the actor 306 identifies or fetches a real world output value 1108 in the actor table 310 linked with the output correlithm object 104. In one embodiment, the real world output value 1108 corresponds with a quantized version of the original input signal. For example, the real world output value 1108 may be an image that is physically smaller and/or an image that uses fewer bits, colors, pixels, etc. than the original image that was received by the correlithm object processing system 300. In other embodiments, the real world output value 1108 may be any suitable type of data sample that corresponds with a quantized version of the original input signal. The real world output value 1108 may be in any suitable data type or format.

At step 1224, the actor 306 outputs the identified real world output value 1108. In one embodiment, the actor 306 may output the real world output value 1108 in real-time to a peripheral device (e.g. a display). In one embodiment, the actor 306 may output the real world output value 1108 to a memory or database. In one embodiment, the real world output value 1108 is sent to another sensor 302. For example, the real world output value 1108 may be sent to another sensor 302 as an input for another process.

FIGS. 13-18 generally describe correlithm object cores which can be used by a correlithm object processing system 300 to classify or group correlithm objects 104 and/or the data samples they represent. A correlithm object core identifies the class or type associated with the set of correlithm objects 104 and/or the data samples they represent.

Data that is processed by conventional computing devices does not have any inherent classifications or grouping information associated with it. For example, a set of data that represents a bunch of images does not provide any information that would allow a conventional computing device to automatically classify or group the images. The data for each image appears as a random numeric value that is unrelated to other numeric values that represent other images. As a result, conventional computing devices require complex signal processing techniques to analyze the images the data represents or a manual process for classifying or grouping the data set. Using complex signal processing consumes a significant amount of the device's resources (e.g. processing power and processing time). Using a manual process is slow, wastes processing resources, and is prone to human error.

In contrast, a device 100 is able to leverage to the categorical numbers used by a correlithm object processing system 300 to generate correlithm object cores which allow the data samples to classified and group together in the correlithm object domain. Using correlithm object cores, the device 100 is able to identify and classify similar types of data samples. Because the device 100 is able to classify data samples in the correlithm object domain, the device 100 does not have to rely on complex signal processing nor does the device 100 have to be configured to perform signal processing on a large number of different data types. This reduces the overall complexity of the device configuration and reduces the amount of resources (e.g. memory and processing time) necessary to perform identify and classify data samples compared to conventional computing systems.

Figure 13:
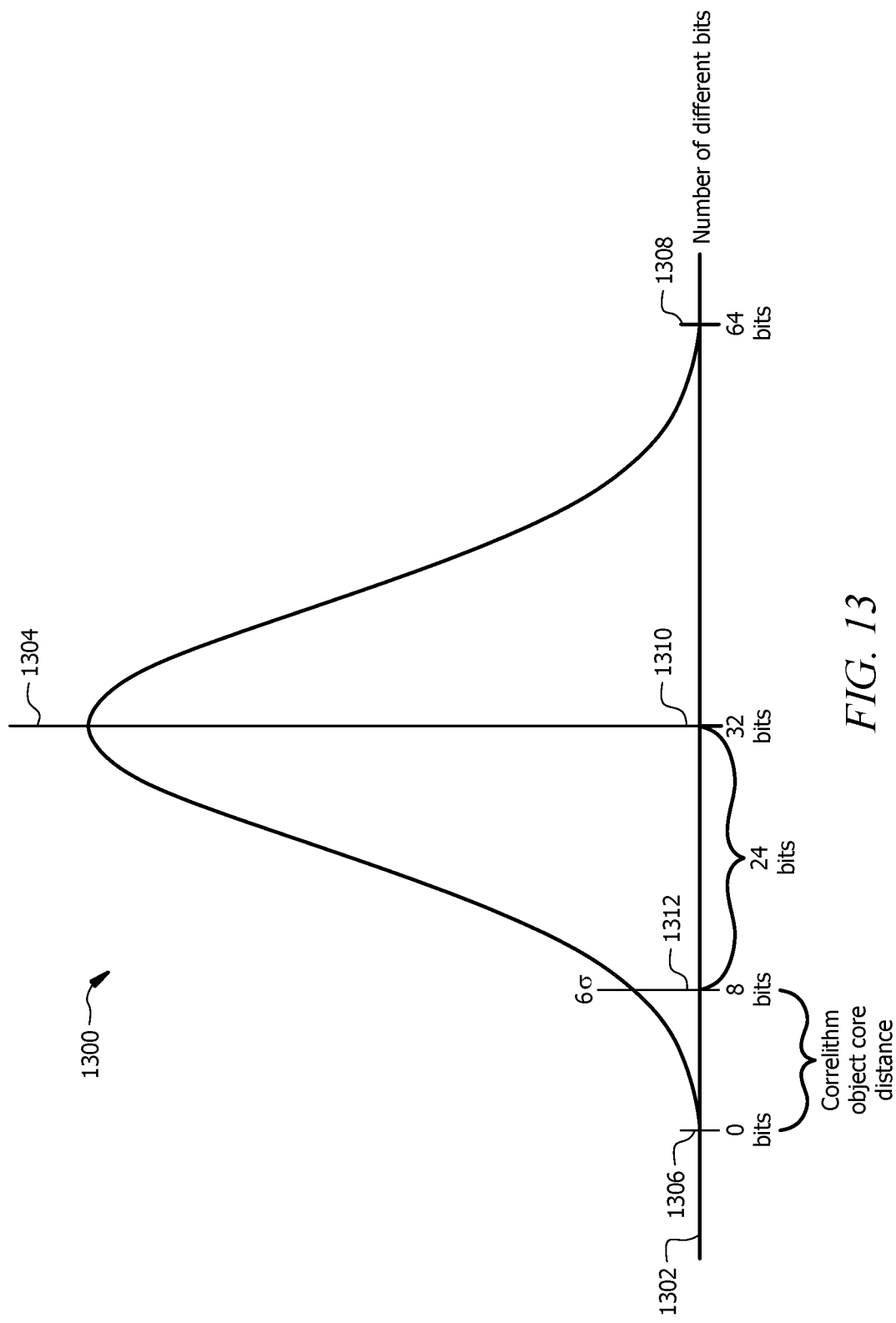
FIG. 13 is an embodiment of a graph of a probability distribution for matching a random correlithm object with a particular correlithm object.
Figure 14:
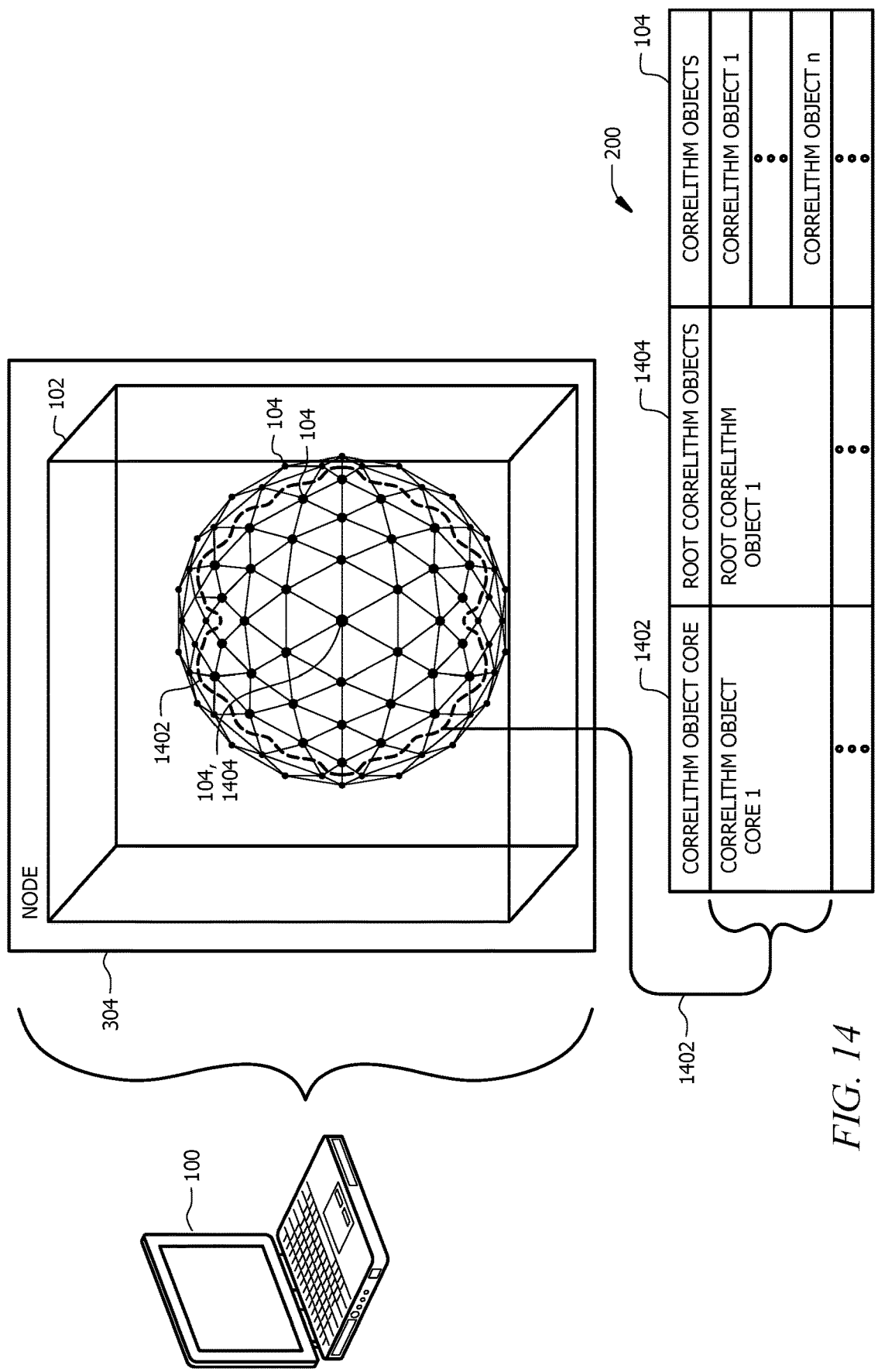
FIG. 14 is a schematic diagram of an embodiment of a device implementing a correlithm object core for a correlithm object processing system.
Figure 15A:
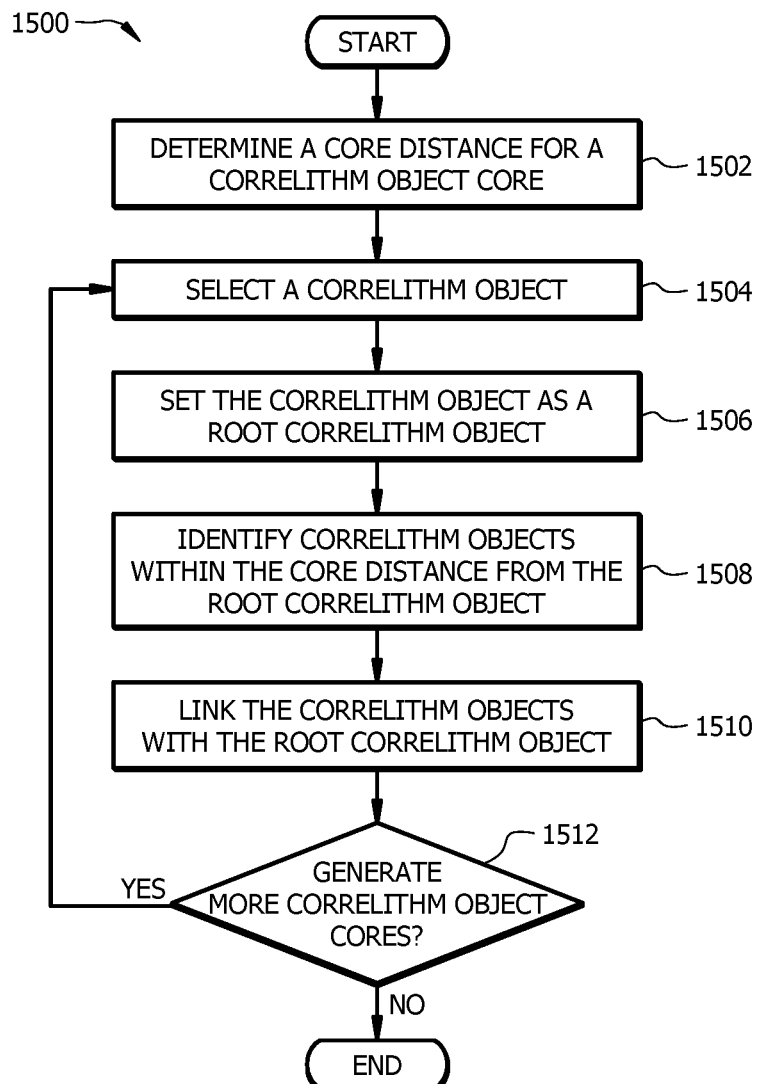
FIG. 15A is a flowchart of an embodiment of a process for emulating a correlithm object core for a correlithm object processing system.
Figure 15B:
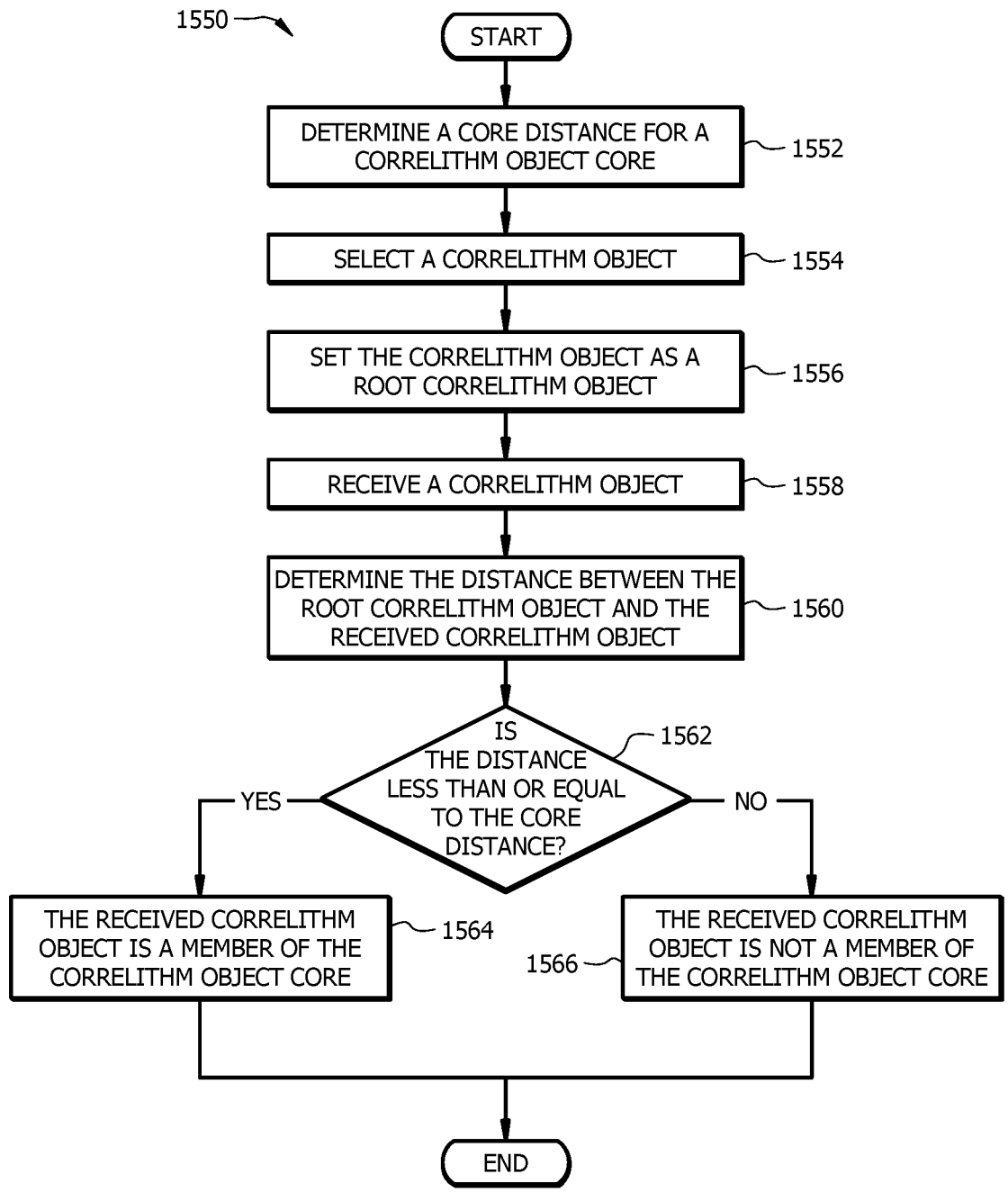
FIG. 15B is a flowchart of another embodiment of a process for emulating a correlithm object core for a correlithm object processing system.
Figure 16:
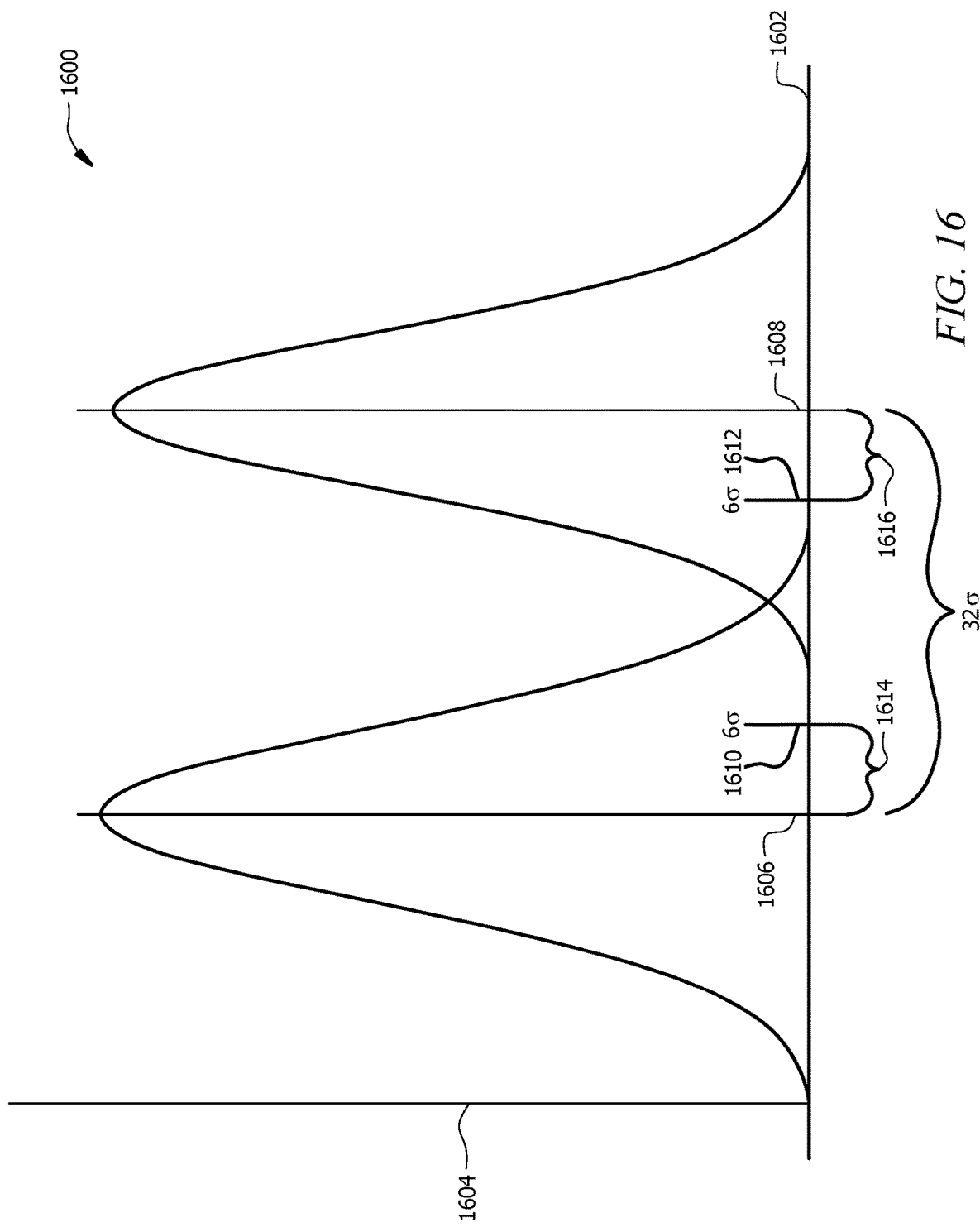
FIG. 16 is an embodiment of a graph of probability distributions for adjacent root correlithm objects.
Figure 17:
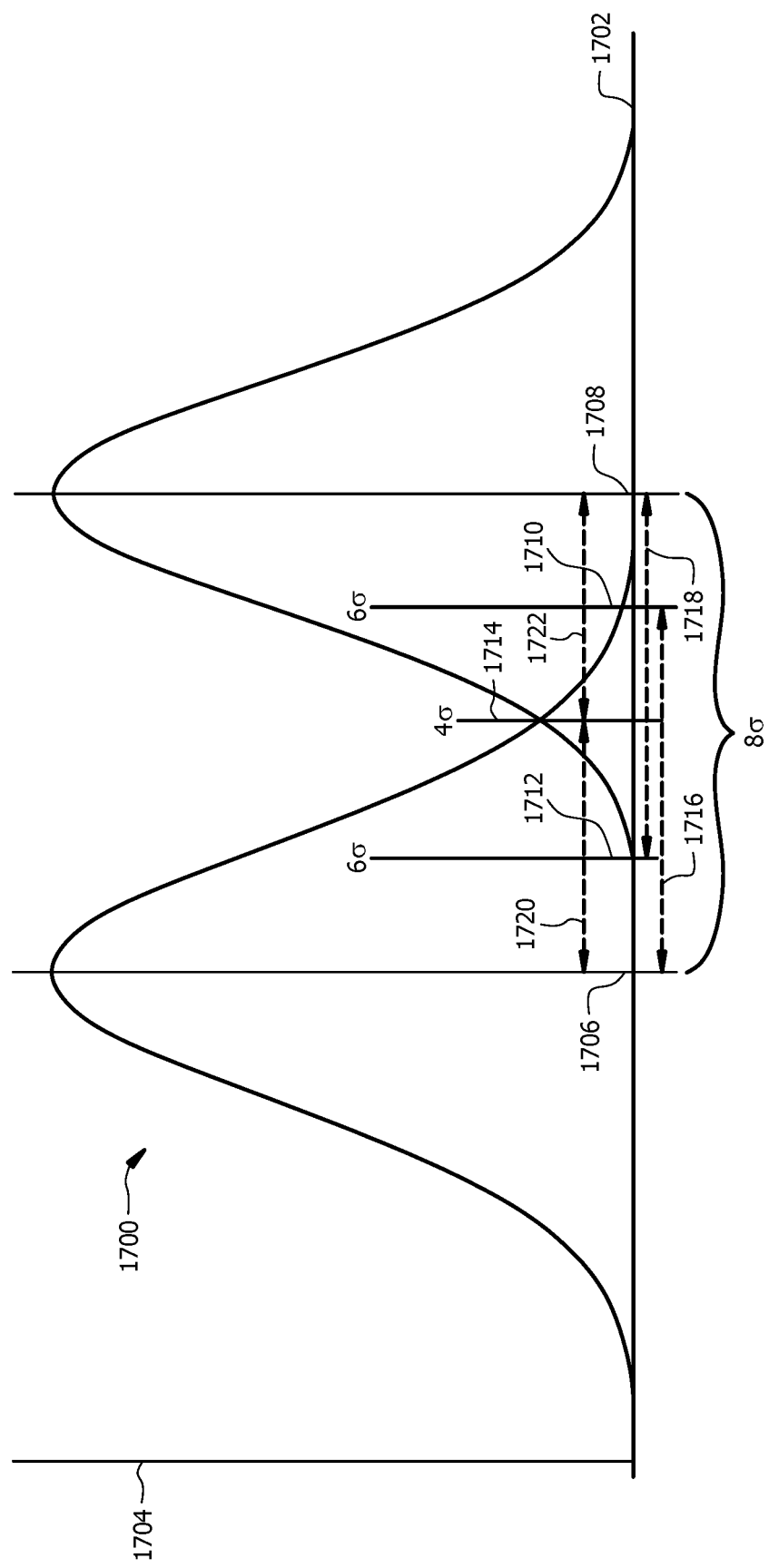
FIG. 17 is another embodiment of a graph of probability distributions for adjacent root correlithm objects.
Figure 18:
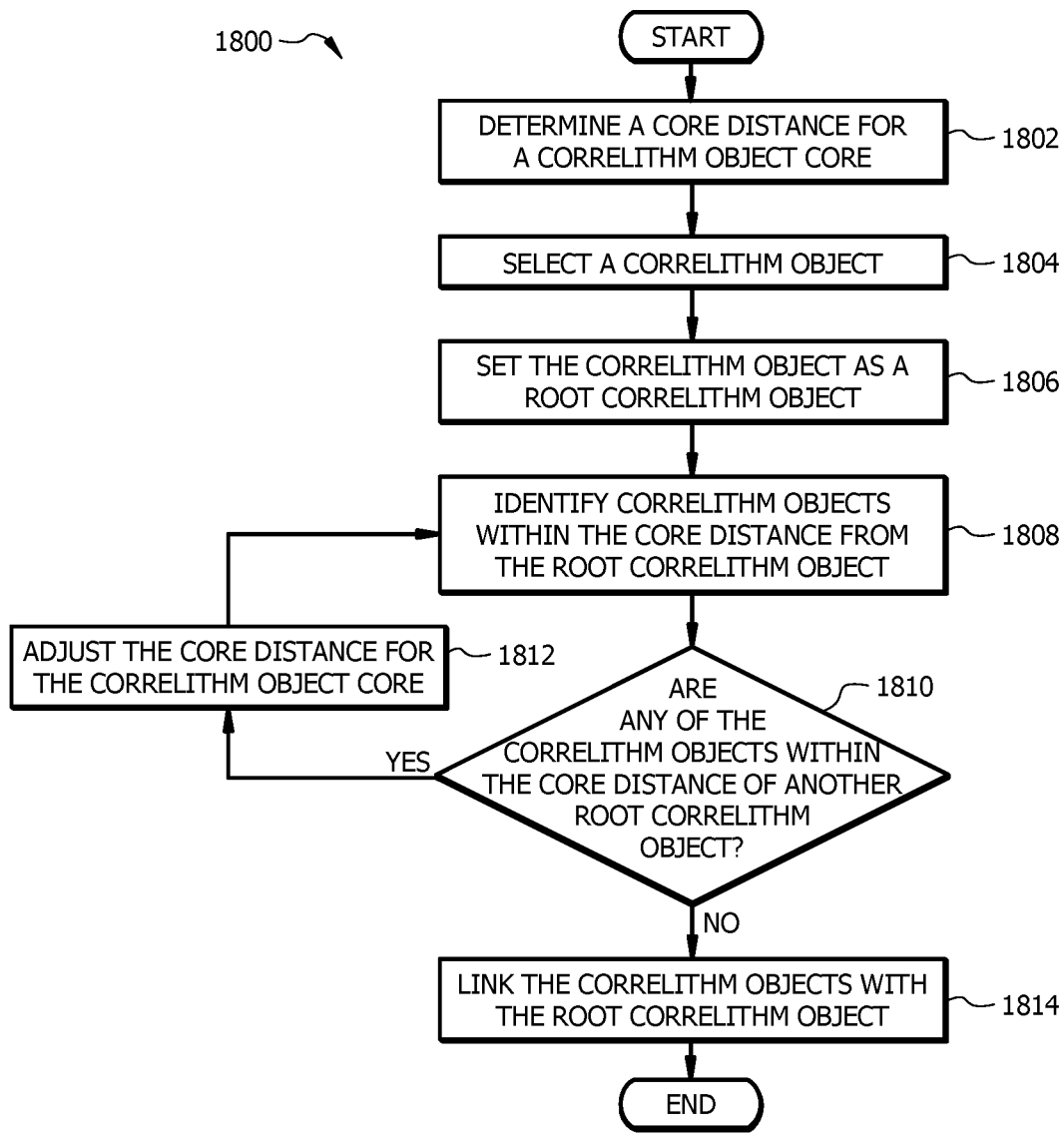
FIG. 18 is a flowchart of an embodiment for refining correlithm objects cores in a correlithm object processing system.

FIG. 13 generally describes how a core distance may be defined for a correlithm object core. FIGS. 14, 15A, and 15B describe embodiments for emulating a correlithm object core in a device 100. FIGS. 16 and 17 generally describe examples of how correlithm object cores may interact with other adjacent correlithm object cores. FIG. 18 describes an embodiment for how a device 100 can adjust the core distance for a correlithm object core.

FIG. 13 is an embodiment of a graph of a probability distribution 1300 for matching a random correlithm object 104 with a particular correlithm object 104. Axis 1302 indicates the number of bits that are different between a random correlithm object 104 with a particular correlithm object 104. Axis 1304 indicates the probability associated with a particular number of bits being different between a random correlithm object 104 and a particular correlithm object 104.

As an example, FIG. 13 illustrates the probability distribution 1300 for matching correlithm objects 104 in a 64-dimensional space 102. In one embodiment, the probability distribution 1300 is approximately a Gaussian distribution. As the number of dimensions in the n-dimensional space 102 increases, the probability distribution 1300 starts to shape more like an impulse response function. In other examples, the probability distribution 1300 may follow any other suitable type of distribution.

Location 1306 illustrates an exact match between a random correlithm object 104 with a particular correlithm object 104. As shown by the probability distribution 1300, the probability of an exact match between a random correlithm object 104 with a particular correlithm object 104 is extremely low. In other words, when an exact match occurs the event is most likely deliberate and not a random occurrence.

Location 1308 illustrates when all of the bits between the random correlithm object 104 with the particular correlithm object 104 are different. In this example, the random correlithm object 104 and the particular correlithm object 104 have 64 bits that are different from each other. As shown by the probability distribution 1300, the probability of all the bits being different between the random correlithm object 104 and the particular correlithm object 104 is also extremely low.

Location 1310 illustrates an average number of bits that are different between a random correlithm object 104 and the particular correlithm object 104. In general, the average number of different bits between the random correlithm object 104 and the particular correlithm object 104 is equal to $$\frac{n}{2},$$

where 'n' is the number of dimensions in the n-dimensional space 102. In this example, the average number of bits that are different between a random correlithm object 104 and the particular correlithm object 104 is 32 bits.

Location 1312 illustrates a cutoff region that defines a core distance for a correlithm object core. The correlithm object 104 at location 1306 may also be referred to as a root correlithm object for a correlithm object core. The core distance defines the maximum number of bits that can be different between a correlithm object 104 and the root correlithm object to be considered within a correlithm object core for the root correlithm object. In other words, the core distance defines the maximum number of hops away a correlithm object 104 can be from a root correlithm object to be considered a part of the correlithm object core for the root correlithm object. Additional information about a correlithm object core is described in FIG. 14. In this example, the cutoff region defines a core distance equal to six standard deviations away from the average number of bits that are different between a random correlithm object 104 and the particular correlithm object 104. In general, the standard deviation is equal to $$\sqrt{\frac{n}{4}},$$

where 'n' is the number of dimensions in the n-dimensional space 102. In this example, the standard deviation of the 64-dimensional space 102 is equal to 4 bits. This means the cutoff region (location 1312) is located 24 bits away from location 1310 which is 8 bits away from the root correlithm object at location 1306. In other words, the core distance is equal to 8 bits. This means that the cutoff region at location 1312 indicates that the core distance for a correlithm object core includes correlithm objects 104 that have up to 8 bits different then the root correlithm object or are up to 8 hops away from the root correlithm object. In other examples, the cutoff region that defines the core distance may be equal any other suitable value. For instance, the cutoff region may be set to 2, 4, 8, 10, 12, or any other suitable number of standard deviations away from location 1310.

FIG. 14 is a schematic diagram of an embodiment of a device 100 implementing a correlithm object core 1402 in a node 304 for a correlithm object processing system 300. In other embodiments, correlithm object cores 1402 may be integrated with a sensor 302 or an actor 306. Correlithm object cores 1402 can be used by a correlithm object processing system 300 to classify or group correlithm objects 104 and/or the data samples they represent. For example, a set of correlithm objects 104 can be grouped together by linking them with a correlithm object core 1402. The correlithm object core 1202 identifies the class or type associated with the set of correlithm objects 104. An example of a process for emulating or generating correlithm object cores 1402 is described in FIGS. 15A and 15B.

In one embodiment, a correlithm object core 1402 comprises a root correlithm object 1404 that is linked with a set of correlithm objects 104. The set of correlithm objects 104 that are linked with the root correlithm object 1404 are the correlithm objects 104 which are located within the core distance of the root correlithm object 1404. The set of correlithm objects 104 are linked with only one root correlithm object 1404. The core distance can be computed using a process similar to the process described in FIG. 13. For example, in a 64-dimensional space 102 with a core distance defined at six sigma, the core distance is equal to 8-bits. This means that correlithm objects 104 within up to eight hops away from the root correlithm object 1404 are members of the correlithm object core 1402 for the root correlithm object 1404.

In one embodiment, a data structure such as node table 200 may be used to map or link root correlithm objects 1404 with sets of correlithm objects 104. The node table 200 is generally configured to identify a plurality of root correlithm objects 1404 and correlithm objects 104 linked with the root correlithm objects 1404. For example, node table 200 may be configured with a first column that lists correlithm object cores 1402, a second column that lists root correlithm objects 1404, and a third column that lists correlithm objects 104. In other examples, the node table 200 may be configured in any other suitable manner or may be implemented using any other suitable data structure. In some embodiments, one or more mapping functions may be used to convert between correlithm objects 104 and a root correlithm object 1404.

FIG. 15A is a flowchart of an embodiment of a process 1500 for emulating a correlithm object core 1402 in a node 304 for a correlithm object processing system 300. Process 1500 provides instructions that allows the user device 100 to emulate or generate correlithm object cores 1402 which can be used by a correlithm object processing system 300 for applications that involve classifying or grouping correlithm objects 104 and/or the data samples they represent.

A non-limiting example is provided to illustrate how the user device 100 implements process flow 1500 to emulate or generate a correlithm object core 1402 for a correlithm object processing system 300. Process 1500 may be applied or extended to a variety of applications that involve classifying or grouping correlithm objects 104 and/or the data samples they represent.

At step 1502, the node 304 determines a core distance for a correlithm object core 1202. The core distance may be determined using a process similar to the process described in FIG. 13.

At step 1504, the node 304 selects a correlithm object 104 in the n-dimensional space 102. For example, the node 304 may randomly select a correlithm object 104. As another example, the node 304 may select a correlithm object 104 based on information provided (e.g. an identifier) by a user of the user device 100.

At step 1506, the node 304 sets the correlithm object 104 as a root correlithm object 1404. In one embodiment, setting the correlithm object 104 as the root correlithm object 1204 comprises adding an entry in a node table 200 that identifies the selected correlithm object 104 as a root correlithm object 1404.

At step 1508, the node 304 identifies correlithm objects 104 within the core distance from the root correlithm object 1204. For example, the node 304 identifies any correlithm objects 104 that are within the maximum number of hops away from the root correlithm object 1404 as defined by the core distance.

At step 1510, the node 304 links the identified correlithm objects 104 with the root correlithm object 1404. In one embodiment, linking the identified correlithm objects 104 with the root correlithm object 1404 comprises adding an entry in the node table 200 that links the correlithm objects 104 with the root correlithm object 1404.

At step 1512, the node 304 determines whether to generate more correlithm object cores 1402. In one embodiment, the node 304 is configured to generate a predetermined number of correlithm object cores 1402 and the node 304 determines whether the predetermined number of correlithm object cores 1402 have been generated. In other embodiment, the node 304 prompts the user of the user device 100 whether or not to generate additional correlithm object cores 1402 and determines whether to generate additional correlithm object cores 1402 based on the users feedback or input. In other embodiments, the node 304 may determine whether to generate more correlithm object cores 1402 based on any other type of input or stimulus. The node 304 returns to step 1504 in response to determining to generate more correlithm object cores 1402. In other words, the node 304 returns to step 1504 to continue generating correlithm object cores 1402. The node 304 terminates process 1500 in response to determining to not generate anymore correlithm object cores 1402.

FIG. 15B is a flowchart of another embodiment of a process 1550 for emulating a correlithm object core 1402 in a node 304 for a correlithm object processing system 300. In this example, the node 304 determines whether a correlithm object 104 is a member of a correlithm object 1402 without previously identifying all of the members of the correlithm object core 1402. Process 1550 may provide improved efficiency and performance when the number of possible correlithm object 104 members for a correlithm object core 1402 is large.

At step 1552, the node 304 determines a core distance for a correlithm object core 1202. The core distance may be determined using a process similar to the process described in FIG. 13.

At step 1554, the node 304 selects a correlithm object 104 in the n-dimensional space 102. For example, the node 304 may randomly select a correlithm object 104. As another example, the node 304 may select a correlithm object 104 based on information provided (e.g. an identifier) by a user of the user device 100.

At step 1556, the node 304 sets the correlithm object 104 as a root correlithm object 1404. In one embodiment, setting the correlithm object 104 as the root correlithm object 1204 comprises adding an entry in a node table 200 that identifies the selected correlithm object 104 as a root correlithm object 1404.

At step 1558, the node 304 receives a correlithm object 104. For example, the node 304 may receive a correlithm object identifier (e.g. a binary string) that identifies a particular correlithm object 104.

At step 1560, the node 304 determines the distance between the root correlithm object 1404 and the received correlithm object 104. For example, the node 304 may determine the distance (e.g. hamming distance) between the root correlithm object 1404 and the correlithm object 104. The node 304 may determine the distance between the root correlithm object 1404 and the received correlithm object 104 using any suitable technique.

At step 1562, the node 304 determines whether the distance between the root correlithm object 1404 and the correlithm object 104 is less than or equal to the core distance for the root correlithm object 1404. In other words, the node 304 determines whether the correlithm object 104 is within the core distance of the root correlithm object 1404. The node 304 proceeds to step 1564 when the distance between the root correlithm object 1404 and the correlithm object 104 is less than or equal to the core distance for the root correlithm object 1404. The node 304 proceeds to step 1566 when the distance between the root correlithm object 1404 and the correlithm object 104 is greater than the core distance for the root correlithm object 1404.

At step 1564, the node 304 determines that the correlithm object 104 is a member of the correlithm object core 1402 associated with the root correlithm object 1404 when the distance between the root correlithm object 1404 and the correlithm object 104 is less than or equal to the core distance for the root correlithm object 1404.

At step 1566, the node 304 determines that the correlithm object 104 is not a member of the correlithm object core 1402 associated with the root correlithm object 1404 when the distance between the root correlithm object 1404 and the correlithm object 104 is greater than the core distance for the root correlithm object 1404.

FIGS. 16 and 17 generally describe examples of how correlithm object cores 1402 may interact with other adjacent correlithm object cores 1402. More specifically, FIG. 16 provides an example where the core distances of adjacent correlithm object cores 1402 do not overlap with each other. FIG. 17 provides an example where the core distances of adjacent correlithm object cores 1402 do overlap with each other.

FIG. 16 is an embodiment of a graph of probability distributions 1600 for adjacent root correlithm objects 1404. Axis 1602 indicates the distance between the root correlithm objects 1404, for example, in units of bits. Axis 1604 indicates the probability associated with the number of bits being different between a random correlithm object 104 and a root correlithm object 1404.

As an example, FIG. 16 illustrates the probability distributions for adjacent root correlithm objects 1404 in a 1024-dimensional space 102. Location 1606 illustrates the location of a first root correlithm object 1404 with respect to a second root correlithm object 1404. Location 1608 illustrates the location of the second root correlithm object 1404. Each root correlithm object 1404 is located an average distance away from each other which is equal to $$\frac{n}{2},$$

where 'n' is the number of dimensions in the n-dimensional space 102. In this example, the first root correlithm object 1404 and the second root correlithm object 1404 are 512 bits or 32 standard deviations away from each other.

In this example, the cutoff region for each root correlithm object 1404 is located at six standard deviations from locations 1606 and 1608. In other examples, the cutoff region may be located at any other suitable location. For example, the cutoff region defining the core distance may one, two, four, ten, or any other suitable number of standard deviations away from the average distance between correlithm objects 104 in the n-dimensional space 102. Location 1610 illustrates a first cutoff region that defines a first core distance 1614 for the first root correlithm object 1404. Location 1612 illustrates a second cutoff region that defines a second core distance 1616 for the second root correlithm object 1404.

In this example, the core distances for the first root correlithm object 1404 and the second root correlithm object 1404 do not overlap with each other. This means that correlithm objects 104 within the correlithm object core 1402 of one of the root correlithm objects 1404 are uniquely associated with the root correlithm object 1404 and there is no ambiguity.

FIG. 17 is another embodiment of a graph of probability distributions 1700 for adjacent root correlithm objects 1404. Axis 1702 indicates the distance between the root correlithm objects 1404, for example, in units of standard deviations. Axis 1704 indicates the probability associated with the number of bits being different between a random correlithm object 104 and a root correlithm object 1404.

As an example, FIG. 17 illustrates the probability distributions for adjacent root correlithm objects 1404 in a 64-dimensional space 102. Location 1706 illustrates the location of a first root correlithm object 1404 with respect to a second root correlithm object 1404. Location 1708 illustrates the location of the second root correlithm object 1404. In this example, the first root correlithm object 1404 and the second root correlithm object 1404 are 32 bits or 8 standard deviations away from each other.

In this example, the cutoff region for each root correlithm object 1404 is located six standard deviations away from locations 1706 and 1708. In other examples, the cutoff region may be located at any other suitable location. Location 1710 illustrates a first cutoff region that defines a first core distance 1716 for the first root correlithm object 1404. Location 1712 illustrates a second cutoff region that defines a second core distance 1718 for the second root correlithm object 1404.

In this example, the initial core distances for the first root correlithm object 1404 and the second root correlithm object 1404 overlap with each other. The first core distance 1710 is only two standard deviations away from the second root correlithm object 1404. The overlapping core distances leads to ambiguity when determining which correlithm object core 1402 a correlithm object 104 belongs to. For instance, a correlithm object 104 at location 1710 is within the correlithm object core 1402 for the first root correlithm object 1404, but it could also be noisy representation of the second root correlithm object 1404 or a member of the correlithm object core 1402 for the second root correlithm object 1404. When core distances between adjacent correlithm object cores 1402 overlap it is difficult to correctly associate or identify correlithm objects 104.

Location 1714 illustrates a modified cutoff region that defines a new core distance (e.g. core distances 1720 and 1722) for the first root correlithm object 1404 and the second root correlithm object 1404. The modified core distance is located at four standard deviations away locations 1706 and 1708. The modified core distance effectively moves the cutoff region for each root correlithm object 1404 away from adjacent root correlithm objects 1404. Adjusting the core distances in this manner results in the core distances for the first root correlithm object 1404 and the second root correlithm object 1404 no longer overlapping and removes the ambiguity when determining which correlithm object core 1402 a correlithm object 104 belongs to. An example of a process for modify the core distance between adjacent correlithm object cores 1402 is described in FIG. 18.

FIG. 18 is a flowchart of another embodiment of a process 1800 for emulating a correlithm object core 1402 for a correlithm object processing system 300. A non-limiting example is provided to illustrate how the user device 100 implements process flow 1800 to emulate or generate a correlithm object core 1402 for a correlithm object processing system 300 where correlithm object cores 1402 may overlap with other correlithm object cores 1402. For example, one or more correlithm object cores 1402 may already exist within an n-dimensional space 102 prior to generating a new correlithm object core 1402. Process 1800 enables the user device 100 refine a generated correlithm object core 1402 to not overlap with other previously existing correlithm object cores 1402.

At step 1802, the node determines a core distance for a correlithm object core 1202. The core distance may be determined using a process similar to the process described in FIG. 13.

At step 1804, the node 304 selects a correlithm object in the n-dimensional space 102. For example, the node 304 may randomly select a correlithm object 104. As another example, the node 304 may select a correlithm object 104 based on information provided (e.g. an identifier) by a user of the user device 100.

At step 1806, the node 304 sets the correlithm object 104 as a root correlithm object 1404. In one embodiment, setting the correlithm object 104 as the root correlithm object 1204 comprises adding an entry in a node table 200 that identifies the selected correlithm object 104 as a root correlithm object 1404.

At step 1808, the node 304 identifies correlithm objects 104 within the core distance from the root correlithm object 1204. For example, the node 304 identifies any correlithm objects 104 that are within the maximum number of hops away from the root correlithm object 1404 as defined by the core distance.

At step 1810, the node 304 determines whether any of the identified correlithm objects 104 are within the core distance of another root correlithm object 1404. For example, the node 304 may determine whether the core distances between adjacent root correlithm objects 1404 overlap with he core distance of the root correlithm object 1404. As another example, the node 304 may determine whether any of the identified correlithm objects 104 are already members of other correlithm object cores 1402 and/or linked with other root correlithm objects 1403. For instance, the node 304 may use a node table 200 to look-up whether any of the correlithm objects 104 have been previously linked with another correlithm object core 1402 and/or root correlithm object 1404.

The node 304 proceeds to step 1812 in response to determining that one or more of the identified correlithm objects 104 is within the core distance of another root correlithm object 1404. When one or more of the identified correlithm objects 104 is within the core distance of another root correlithm object 1404, the node 304 proceeds to step 1812 to adjust the core distance for the correlithm object core 1402. Adjusting the core distance removes the ambiguity caused by overlapping core distances. The node 304 proceeds to step 1814 in response to determining that none of the identified correlithm objects 104 are within the core distance of another root correlithm object 1404.

At step 1812, the node 304 adjusts the core distance for the correlithm object core 1402. In one embodiment, the node 304 adjusts the core distance for the correlithm object core 1402 by reducing the core distance. For example, the node 304 may determine the average distance between the root correlithm object 1404 and an adjacent root correlithm object 1404 and set the core distance to half of the average distance. For instance, referring to FIG. 17, the average distance between the root correlithm objects 1404 is eight standard deviations. The modified core distance is set to four standard deviations which is equal to half the average distance between the root correlithm objects 1404. In other embodiment, the node 304 may adjust the core distance for the correlithm object core 1402 using any other suitable approach.

Returning to step 1810, the node 304 proceeds to step 1814 in response to determining that none of the identified correlithm objects 104 are within the core distance of another root correlithm object 1404. At step 1814, the node 304 links the identified correlithm objects 104 with the root correlithm object 1404. In one embodiment, linking the identified correlithm objects 104 with the root correlithm object 1404 comprises adding an entry in the node table 200 that identifies the correlithm objects 104 associated with the root correlithm object 1404.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

To aid the Patent Office, and any readers of any patent issued on this application in interpreting the claims appended hereto, applicants note that they do not intend any of the appended claims to invoke 35 U.S.C. § 112(f) as it exists on the date of filing hereof unless the words "means for" or "step for" are explicitly used in the particular claim.

The invention claimed is:

1. A device configured to emulate a quantizer in a correlithm object processing system, comprising:
a memory operable to store:
    a sensor table that identifies:
        a plurality of real world value entries; and
        a plurality of input correlithm objects, wherein:
            each input correlithm object is a point in a first n-dimensional space represented by a binary string, and
            each input correlithm object is linked with a real world value entry from among the plurality of real world value entries;
    a node table that identifies:
        a plurality of child correlithm objects, wherein each child correlithm object is a point in the first n-dimensional space represented by a binary string; and
        a plurality of parent correlithm objects, wherein:
            each parent correlithm object is a point in a second n-dimensional space represented by a binary string; and
            each parent correlithm object is linked with two or more child correlithm objects from among the plurality of child correlithm objects;
    wherein:
        the first n-dimensional space has a greater number of dimensions than the second n-dimensional space;
        the first n-dimensional space is embedded in the second n-dimensional space; and
        each parent correlithm object is a standard distance away from other parent correlithm objects; and
a sensor engine operably coupled to the memory, configured to emulate a sensor configured to:
    receive an input signal representing a data sample;
    identify a real world value entry in the sensor table based on the input signal;
    fetch an input correlithm object in the sensor table linked with the real world value entry;
    send the identified input correlithm object to a node engine;
the node engine operably coupled to the memory, configured to emulate a node configured to:
    determine distances between the input correlithm object and each of the child correlithm objects in the node table in response to receiving the input correlithm object, wherein the distance between the input correlithm object and a child correlithm object is determined based on differences between a binary string representing the input correlithm object and binary strings linked with each of the child correlithm objects;
    identify a child correlithm object from the node table with the shortest distance;

fetch a parent correlithm object from the node table linked with the identified child correlithm object;

output the identified parent correlithm object.

2. The device of claim 1, wherein each of the plurality of child correlithm objects in the node table is linked with only one parent correlithm object.

3. The device of claim 1, wherein the input signal is received from a peripheral device.

4. The device of claim 1, wherein determining distances between the input correlithm object and each of the child correlithm objects in the node table comprises determining a hamming distance between the input correlithm object and a child correlithm object.

5. The device of claim 1, wherein determining distances between the input correlithm object and each of the child correlithm objects in the node table comprises:

performing an XOR operation between the input correlithm object and a child correlithm object to generate a binary string; and counting the number of logical high values in the binary string.

6. The device of claim 1, wherein:

the memory is operable to store an actor table that identifies:

a plurality of output correlithm objects, wherein each output correlithm object is a point in the second n-dimensional space represented by a binary string; and a plurality of real world output values, wherein each real world output value is linked with an output correlithm object from among the plurality of output correlithm objects; and further comprising an actor engine operably coupled to the memory, configured to emulate an actor configured to:

receive the parent correlithm object;

determine distances between the parent correlithm object and each of the output correlithm objects in the actor table in response to receiving parent correlithm object, wherein the distance between the parent correlithm object and an output correlithm object is based on differences between a binary string representing the parent correlithm object and binary strings linked with each of the output correlithm objects;

identify an output correlithm object from the actor table with the shortest distance;

fetch a real world output value from the actor table linked with the identified output correlithm object; and output the real world output value.

7. The device of claim 6, wherein outputting the real world output value comprises sending the real world output value to a peripheral device.

8. A method for emulating a quantizer in a correlithm object processing system, comprising:

receiving, by a sensor engine, an input signal representing a data sample;

identifying, by the sensor engine, a real world value entry in a sensor table based on the input signal, wherein the sensor table identifies:

a plurality of real world value entries; and a plurality of input correlithm objects, wherein:

each input correlithm object is a point in a first n-dimensional space represented by a binary string, and each input correlithm object is linked with a real world value entry from among the plurality of real world value entries;

fetching, by the sensor engine, an input correlithm object in the sensor table linked with the real world value entry;

sending, by the sensor engine, the identified input correlithm object to a node engine;

determining, by the node engine, distances between the input correlithm object and each of the child correlithm objects in a node table in response to receiving the input correlithm object, wherein:

the distance between the input correlithm object and a child correlithm object is determined based on differences between a binary string representing the input correlithm object and binary strings linked with each of the child correlithm objects;

the node table identifies:

a plurality of child correlithm objects, wherein each child correlithm object is a point in the first n-dimensional space represented by a binary string; and a plurality of parent correlithm objects, wherein:

each parent correlithm object is a point in a second n-dimensional space represented by a binary string;

each parent correlithm object is a standard distance away from other parent correlithm objects; and each parent correlithm object is linked with two or more child correlithm objects from among the plurality of child correlithm objects;

the first n-dimensional space has a greater number of dimensions than the second n-dimensional space; and the first n-dimensional space is embedded in the second n-dimensional space;

identifying, by the node engine, a child correlithm object from the node table with the shortest distance;

fetching, by the node engine, a parent correlithm object from the node table linked with the identified child correlithm object;

outputting, by the node engine, the identified parent correlithm object.

9. The method of claim 8, wherein each of the plurality of child correlithm objects in the node table is linked with only one parent correlithm object.

10. The method of claim 8, wherein the input signal is received from a peripheral device.

11. The method of claim 8, wherein determining distances between the input correlithm object and each of the child correlithm objects in the node table comprises determining a hamming distance between the input correlithm object and a child correlithm object.

12. The method of claim 8, wherein determining distances between the input correlithm object and each of the child correlithm objects in the node table comprises:

performing an XOR operation between the input correlithm object and a child correlithm object to generate a binary string; and counting the number of logical high values in the binary string.

13. The method of claim 8, further comprising:

receiving, by an actor engine, the parent correlithm object;

determining, by the actor engine, distances between the parent correlithm object and each of the output correlithm objects in an actor table in response to receiving parent correlithm object, wherein:
the distance between the parent correlithm object and an output correlithm object is based on differences between a binary string representing the parent correlithm object and binary strings linked with each of the output correlithm objects; and
the actor table identifies:
a plurality of output correlithm objects, wherein each output correlithm object is a point in the second n-dimensional space represented by a binary string; and
a plurality of real world output values, wherein each real world output value is linked with an output correlithm object from among the plurality of output correlithm objects;
identifying, by the actor engine, an output correlithm object from the actor table with the shortest distance;
fetching, by the actor engine, a real world output value from the actor table linked with the identified output correlithm object; and
outputting, by the actor engine, the real world output value.

14. The method of claim 13, wherein outputting the real world output value comprises sending the real world output value to a peripheral device.

15. A system for emulating a correlithm object processing system, comprising:
a first device comprising:
a first memory operable to store a sensor table that identifies:
a plurality of real world value entries; and
a plurality of input correlithm objects, wherein:
each input correlithm object is a point in a first n-dimensional space represented by a binary string, and
each input correlithm object is linked with a real world value entry from among the plurality of real world value entries; and
a sensor engine operably coupled to the first memory, configured to emulate a sensor configured to:
receive an input signal representing a data sample;
identify a real world value entry in the sensor table based on the input signal;
fetch an input correlithm object in the sensor table linked with the real world value entry;
send the identified input correlithm object to a node engine; and
a second device in signal communication with the first device, comprising:
a second memory operable to store a node table that identifies:
a plurality of child correlithm objects, wherein each child correlithm object is a point in the first n-dimensional space represented by a binary string; and
a plurality of parent correlithm objects, wherein:
each parent correlithm object is a point in a second n-dimensional space represented by a binary string; and
each parent correlithm object is linked with two or more child correlithm objects from among the plurality of child correlithm objects;
wherein:
the first n-dimensional space has a greater number of dimensions than the second n-dimensional space;
the first n-dimensional space is embedded in the second n-dimensional space; and
each parent correlithm object is a standard distance away from other parent correlithm objects; and
the node engine operably coupled to the second memory, configured to emulate a node configured to:
receive the identified input correlithm object;
determine distances between the input correlithm object and each of the child correlithm objects in the node table in response to receiving the input correlithm object, wherein the distance between the input correlithm object and a child correlithm object is determined based on differences between a binary string representing the input correlithm object and binary strings linked with each of the child correlithm objects;
identify a child correlithm object from the node table with the shortest distance;
fetch a parent correlithm object from the node table linked with the identified child correlithm object;
output the identified parent correlithm object.

16. The system of claim 15, wherein each of the plurality of child correlithm objects in the node table is linked with only one parent correlithm object.

17. The system of claim 15, wherein the input signal is received from a peripheral device.

18. The system of claim 15, wherein determining distances between the input correlithm object and each of the child correlithm objects in the node table comprises determining a hamming distance between the input correlithm object and a child correlithm object.

19. The system of claim 15, wherein determining distances between the input correlithm object and each of the child correlithm objects in the node table comprises:
performing an XOR operation between the input correlithm object and a child correlithm object to generate a binary string; and
counting the number of logical high values in the binary string.

20. The system of claim 15, further comprising a third device in signal communication with the second device, comprising:
a third memory is operable to store an actor table that identifies:
a plurality of output correlithm objects, wherein each output correlithm object is a point in the second n-dimensional space represented by a binary string; and
a plurality of real world output values, wherein each real world output value is linked with an output correlithm object from among the plurality of output correlithm objects; and
further comprising an actor engine operably coupled to the third memory, configured to emulate an actor configured to:
receive the parent correlithm object;
determine distances between the parent correlithm object and each of the output correlithm objects in the actor table in response to receiving parent correlithm object, wherein the distance between the parent correlithm object and an output correlithm object is based on differences between a binary string representing the parent correlithm object and binary strings linked with each of the output correlithm objects;

identify an output correlithm object from the actor table with the shortest distance;
fetch a real world output value from the actor table linked with the identified output correlithm object; and
output the real world output value.

\* \* \* \* \*